United States Patent [19]

Libert

[11] Patent Number: 4,876,468
[45] Date of Patent: Oct. 24, 1989

[54] THYRISTOR DRIVER TURN-OFF CIRCUIT
[75] Inventor: James T. Libert, Waukesha, Wis.
[73] Assignee: Square D Company, Palatine, Ill.
[21] Appl. No.: 919,914
[22] Filed: Oct. 16, 1986
[51] Int. Cl.[4] .............................................. F21V 33/00
[52] U.S. Cl. ...................................... 307/643; 363/96; 307/646
[58] Field of Search ........................ 318/812, 800, 801; 363/96; 307/252 R, 252 C, 252 UA, 252 N, 643, 644, 645, 633, 646, 630

[56] References Cited

U.S. PATENT DOCUMENTS

| | | | |
|---|---|---|---|
| 3,457,430 | 7/1969 | Samuelson | 307/630 |
| 3,728,557 | 4/1973 | Pelly et al. | 307/252 N |
| 4,298,810 | 11/1981 | Dinger et al. | 307/252 N |
| 4,417,156 | 11/1983 | Fukui et al. | 307/633 |

Primary Examiner—William M. Shoop, Jr.
Assistant Examiner—Brian Young
Attorney, Agent, or Firm—A. Sidney Johnston

[57] ABSTRACT

A gate drive circuit for a thyristor has a power supply and an amplifier for supplying current to a gate electrode of the thyristor. A timing signal is generated to initiate conduction of the thyristor. A voltage level signal is generated in response to a voltage from cathode to anode of the thyristor to indicate a reduction in the cathode to anode voltage of the thyristor when the voltage is reduced by conduction of the thyristor. Current is supplied to the gate electrode of the thyristor in response to the timing signal, and current ceases to flow to the gate electrode of the thyristor at a predetermined time interval following generation of the voltage level signal indicative of a collapse in cathode to anode voltage of the thyristor caused by conduction of the thyristor, and the predetermined time interval is chosen to be of sufficient duration to permit conduction of the thyristor to reach a stable value before current flow to the gate electrode of the thyristor substantially ceases.

15 Claims, 21 Drawing Sheets

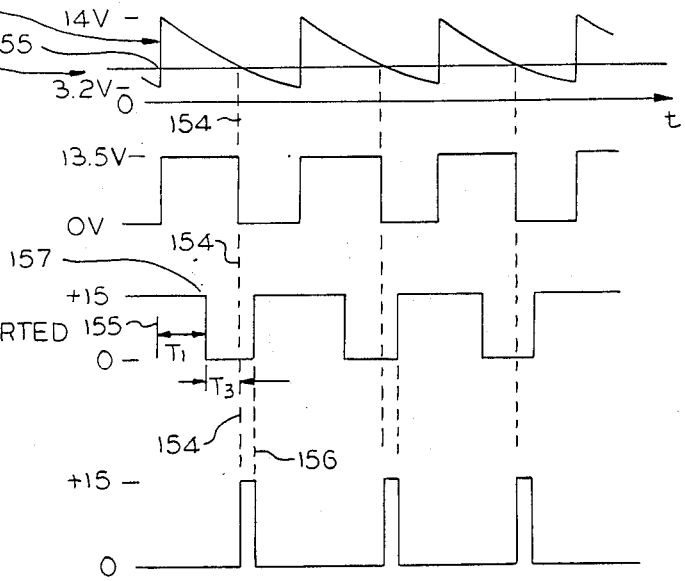
SAWTOOTH AT PIN 3 OF IC 11
PIN 2 OF IC 11 (SIG. 3)
FIG. 14A
1 OF IC 11
2 OF IC 5
FIG. 14B
1 OF IC 5
(FEEDBACK FROM SHORTED SCR DETECTOR)
FIG. 14C
9 OF IC 5
FIG. 14D
FULL CONDUCTION CONDITION
FIG. 14E
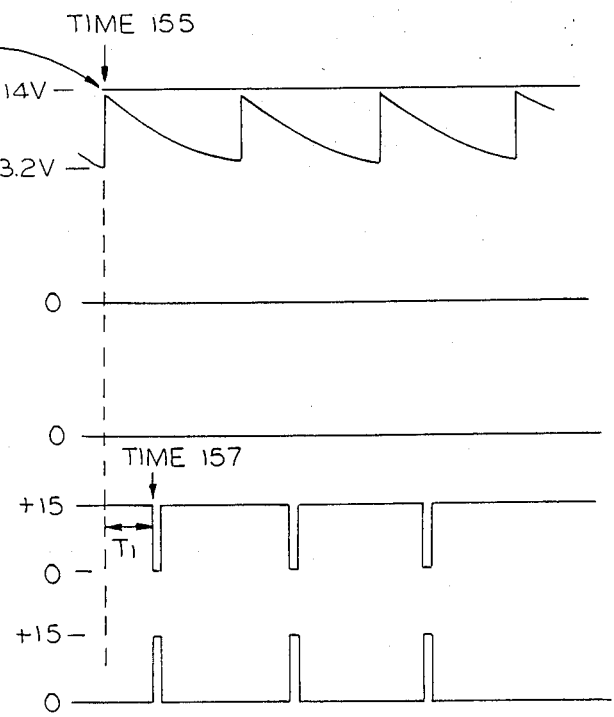
PIN 2 OF IC 11 SIGNAL 3
SAWTOOTH 3 OF IC 11
FIG. 14F
PIN 1 OF IC 11
PIN 2 OF IC 5
FIG. 14G
PIN 8 OF IC 5
FIG. 14H
PIN 1 OF IC 5
FIG. 14J
PIN 9 OF IC 5
LOGIC OUTPUT

9 OF IC 5
LOGIC OUTPUT

PULSE TRANSFORMER
DRIVE
15 & 16 OF IC 3

PULSE TRANSFORMER
LEADS 3 & 5
P1,3 & 5
GATE DRIVE

L1 TO T1

PIN 6 OF IC 7
PIN 1 OF IC 5
SIG.6

FULL CONDUCTION CONDITION
9 OF IC 5
LOGIC OUTPUT

PULSE TRANSFORMER
DRIVE
15 & 16 OF IC 3

PULSE TRANSFORMER LEADS
PT 1,3 & 5

L1 TO T1

PIN 1 OF IC 5
LOGIC INPUT

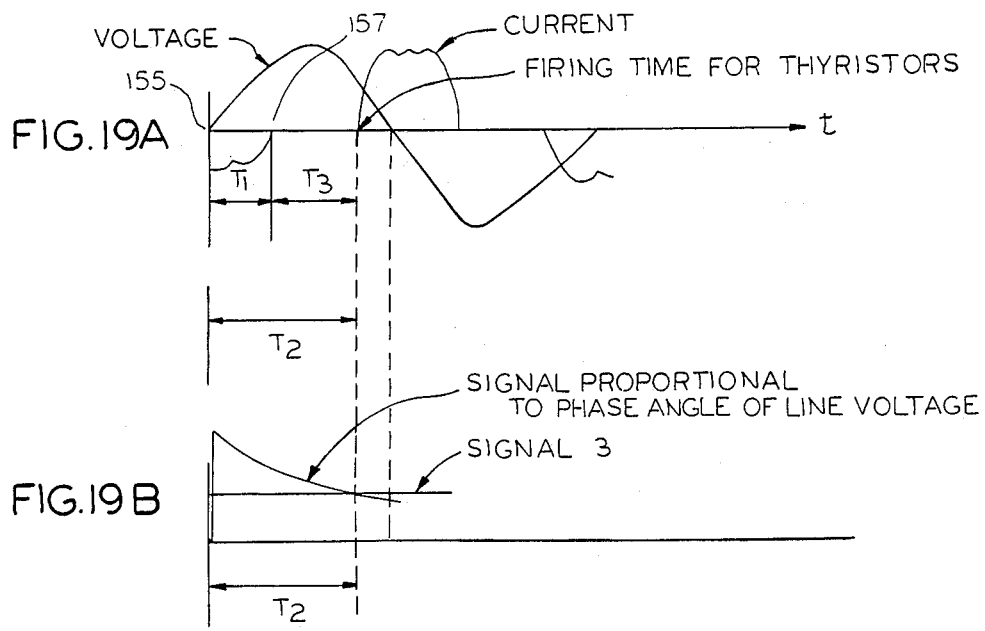
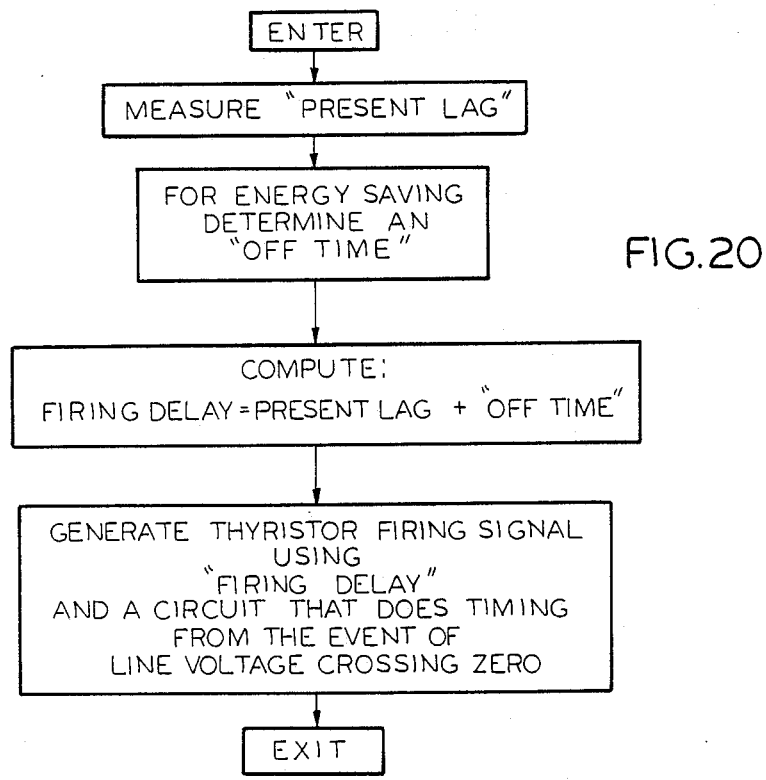

PREVENTING MOTOR OSCILLATION

PREVENTING MOTOR OSCILLATION 4,876,468

THYRISTOR DRIVER TURN-OFF CIRCUIT

FIELD OF THE INVENTION

This invention relates to gate drive circuits for thyristors, and more particularly relates to turning off the gate drive to a thyristor.

BACKGROUND OF THE INVENTION

It is necessary to supply a gate drive current to the gate electrode of a thyristor in order to turn the thyristor on. However, it is not necessary to maintain current flow to the control electrode after the thyristor is turned on.

A problem arises in the utilization of power thyristors in that the gate drive power supply must be sized to provide the current necessary to initiate conduction of the thyristor, and in former designs the gate drive power supply must continue delivering current to the control electrode of the thyristor during conduction of the thyristor. The continuing supply of current to the control electrode of the thyristor requires that the gate drive power supply be sized larger than necessary. Also, supplying continuous gate drive current is an unnecessary waste of electrical current, particularly since it tends to simply heat the power supply and accomplish no useful function. A further problem is to find a way to limit current flow to a thyristor gate during full conduction operation of the motor.

SUMMARY OF THE INVENTION

The invention provides a solution to the problem of continued power dissipation by the power supply for the gate drive electrode of a thyristor by detecting the collapse in voltage across the thyristor occasioned by initiation of conduction of the thyristor, and using this collapse in voltage across the thyristor to turn off the gate drive current. A gate drive circuit for a thyristor has a power supply and an amplifier for supplying current to a gate electrode of the thyristor. A timing signal is generated to initiate conduction of the thyristor. A voltage level signal is generated in response to a voltage from cathode to anode of the thyristor to indicate a reduction in the cathode to anode voltage of the thyristor when the voltage is reduced by conduction of the thyristor. Current is supplied to the gate electrode of the thyristor in response to the timing signal, and current ceases to flow to the gate electrode of the thyristor at a predetermined time interval following generation of the voltage level signal indicative of a collapse in cathode to anode voltage of the thyristor caused by conduction of the thyristor, and the predetermined time interval is chosen to be of sufficient duration to permit conduction of the thyristor to reach a stable value before current flow to the gate electrode of the thyristor substantially ceases.

Other and further aspects of the present invention will become apparent during the course of the following description and by reference to the accompanying drawings.

BRIEF DESCRIPTION OF THE DRAWINGS

Referring now to the drawings, in which like numerals represent like parts in the several views:

FIG. 14A–FIG. 14J show voltage waveforms phase sequence angle controller.

FIG. 15A–FIG. 15K are graphs showing voltage waveforms in a thyristor gate driver/voltage sensor.

FIGS. 19A, 19B are graphs showing timing on an AC waveform.

FIG. 20 is a flow diagram showing current control firing.

DETAILED DESCRIPTION

Hardware

Block Diagram

Figure 1:
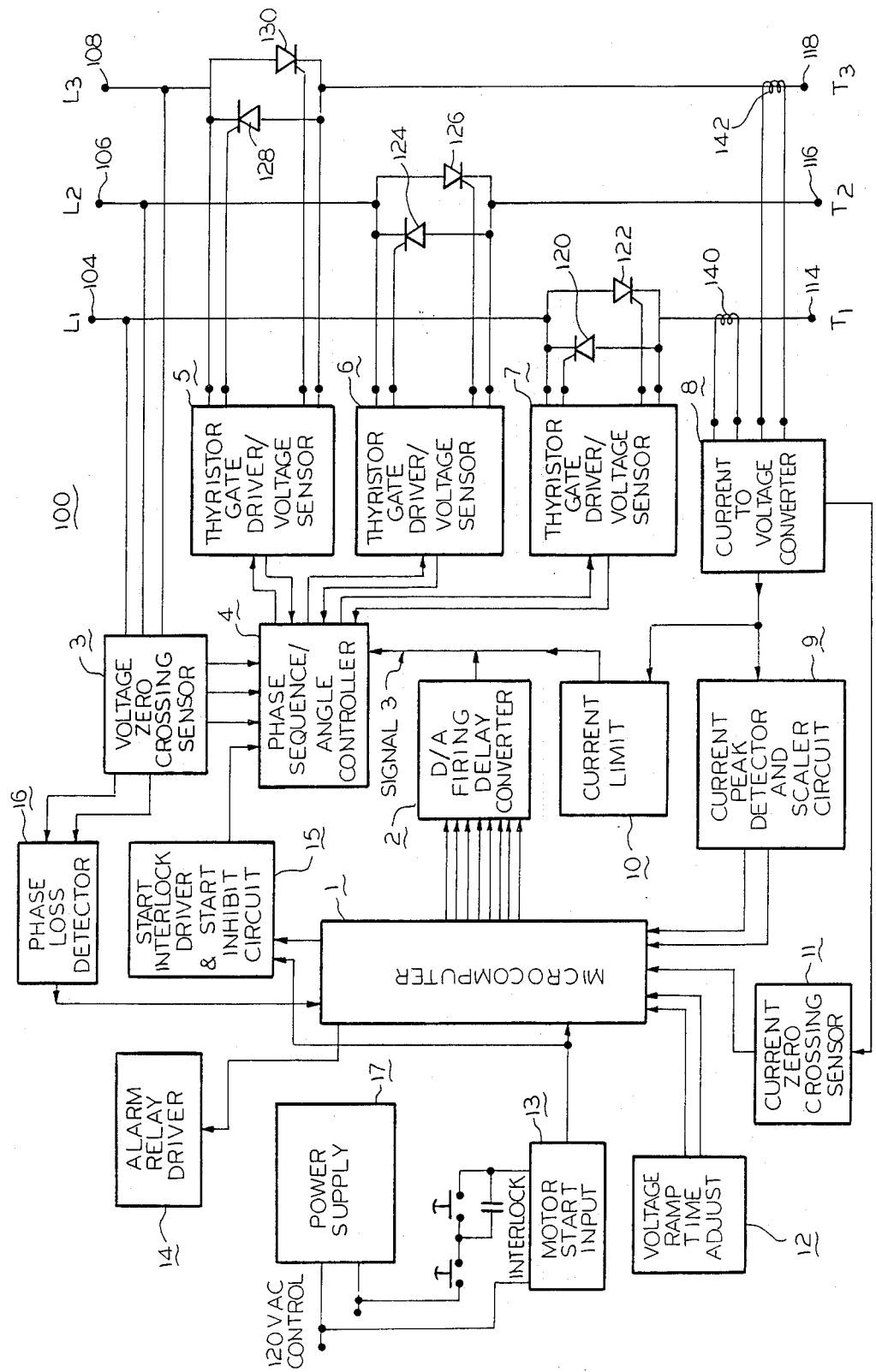
FIG. 1 is a block diagram of a microcomputer controlled solid state motor controller.

FIG. 1 is a block diagram of a microcomputer controlled motor controller for a three phase alternating current line. The functional blocks shown in FIG. 1 are given reference numerals 1 through 17. Detailed schematic embodiments of these functional blocks will be discussed hereinbelow.

Microcomputer 1 controls the firing angle of thyristors which control the flow of current from a three phase alternating current line to a three phase inductive load such as a three phase motor. Digital to analog firing delay converter 2 accepts digital input from microcomputer 1, and generate an analog voltage output on the line marked signal 3 to control operation of phase sequence angle controller 4.

The three phase alternating current power line has line L1 at terminal 104, line L2 at terminal 106, and line L3 at terminal 108. A load is attached to line L1 at load terminal 114. A load is attached to line L2 at load terminal 116. A load is attached to line L3 at load terminal 118. Thyristors 120, 122 control current flow in line L1 from line terminal 104 to load terminal 114. Thyristors 124, 126 control the flow of electric current from line L2 at terminal 106 to the load at load terminal 116. Thyristors 128, 130 control the flow of current from line L3 at terminal 108 to the load at load terminal 118.

Voltage zero crossing sensor 3 has inputs from each of the three phase lines at terminals 104, 106, 108. Voltage zero crossing sensor 3 drives phase sequence angle controller 4. Phase sequence angle controller 4 also has an input from start interlock driver and start inhibit 15 and a control input from digital/analog firing delay converter 2 identified as signal 3. In response to its inputs, phase sequence controller 4 generates firing signals for thyristor gate driver/voltage sensor circuits 5, 6, 7.

The control electrodes of thyristors 120, 122 receive their gate drive current from gate drive/voltage sensor circuit 7. Thyristors 124, 126 receive their gate current from gate driver/voltage sensor circuit 6. Thyristors 128, 130 receive their gate drive from gate driver/voltage sensor circuit 5.

In addition, phase sequence angle controller 4 accepts inputs from thyristor gate driver/voltage sensor circuits 5, 6, 7, and these inputs specify the voltage drop across the respective thyristors. When no current flows through a respective thyristor pair, the voltage drop across the thyristors is large, however after conduction of one thyristor of the pair is achieved the voltage drop across the thyristors becomes small. This reduction in voltage drop across a conducting thyristor causes phase sequence angle controller 4 to discontinue drive current to the gate of the respective thyristor. Removal of gate driven upon initiation of conduction of the thyristor saves control circuit power and also reduces wear and tear on the thyristor.

Current flow to the load is monitored by current to voltage converter 8. Current transformer 140 and current transformer 142 detect the current flow in lines L1 and L3 respectively, and provide analog input to microprocessor 1 indicative of the total three phase current flow to the load. Current to voltage converter 8 provides input to current peak detector and scaler 9, current limit circuit 10, and current zero crossing sensor 11. Current peak detector and scaler 9 provides a connection to microcomputer 1 which is indicative of current flow to the load. Current limit circuit 10 provides an inhibit signal on the line marked Signal 3 if the load current exceeds a preset value. Current zero crossing sensor 11 provides an input to microcomputer 1 which, in conjunction with an input to microcomputer 1 from voltage zero crossing sensor 3, provides timing from the event of voltage in line L1 crossing zero to current to the load in line L1 crossing zero.

The terminology of a "current crossing zero" event, and a "current crossing zero" detector is used throughout this document. However, it is to be understood that the apparatus described herein uses thyristor switches to control the current flow to a load. In a particular AC line, of a 3 phase AC line, back to back thyristor pairs such as 120, 122, pair 124, 126, and pair 128, 130 control current flow in lines L1, L2, and L3 respectively. As the voltage applied across a thyristor pair crosses zero, the conducting thyristor will quit conducting. The other thyristor of the back to back pair will not begin to conduct until a gate drive signal is applied thereto. Thus, the current flow in the line will not "cross zero", but will simply "reach zero" and stay there until the other thyristor of the back to back pair is fired. The phrase "zero crossing" of the current is to be understood as the point in time at which the current flow through the thyristor "reaches zero" even though the current may remain OFF for an OFF TIME determined by the timing of the application of a gate drive "firing signal" to the other thyristor. In practice, it has been found convenient to use a silicon controlled rectifier (SCR) for a thyristor.

During starting of a motor, microcomputer 1 slowly varies the voltage applied to the motor in order to achieve a soft start. The voltage applied to the motor is controlled by control of the firing time of the thyristors. Voltage ramp time adjust 12 provides an input to microcomputer 1 which determines the rate at which the voltage applied to the load increases with time.

Motor start input 13 provides an input to microcomputer 1 telling it to start the motor, that is to start applying voltage to the load. Motor start input also provides an input to "start interlock" block 15. "Start interlock" block 15 provides inhibition of thyristor firing.

Alarm relay driver 14 accepts output from microcomputer 1 to indicate a fault condition and to close an external circuit to initiate further action. The further action may be to shut down other equipment as a result of the fault condition, warn an operator at a remote location, etc.

Start interlock driver and start inhibit circuit 15 accepts output from microcomputer 1 to initiate motor starting and to inhibit motor running in the case that a fault condition is detected by microcomputer 1.

Phase loss detector 16 provides an input to microcomputer 1 in the event that voltage is lost on one of the phases of three phase line L1, L2, L3. The loss of voltage on one of the phases causes microcomputer 1 to prevent the motor from starting.

A detailed description of the schematic diagrams of the circuits follows. The description is broken into functional subheadings as shown hereinbelow.

Thyristor Firing Control

Microcomputer 1 generates a voltage on terminal 150, indicted as sig 3, referred to as signal 3 hereinabove, and this voltage controls the phase angle at which conduction in the appropriate thyristor is initiated, as will be described in greater detail hereinbelow.

Figure 3:
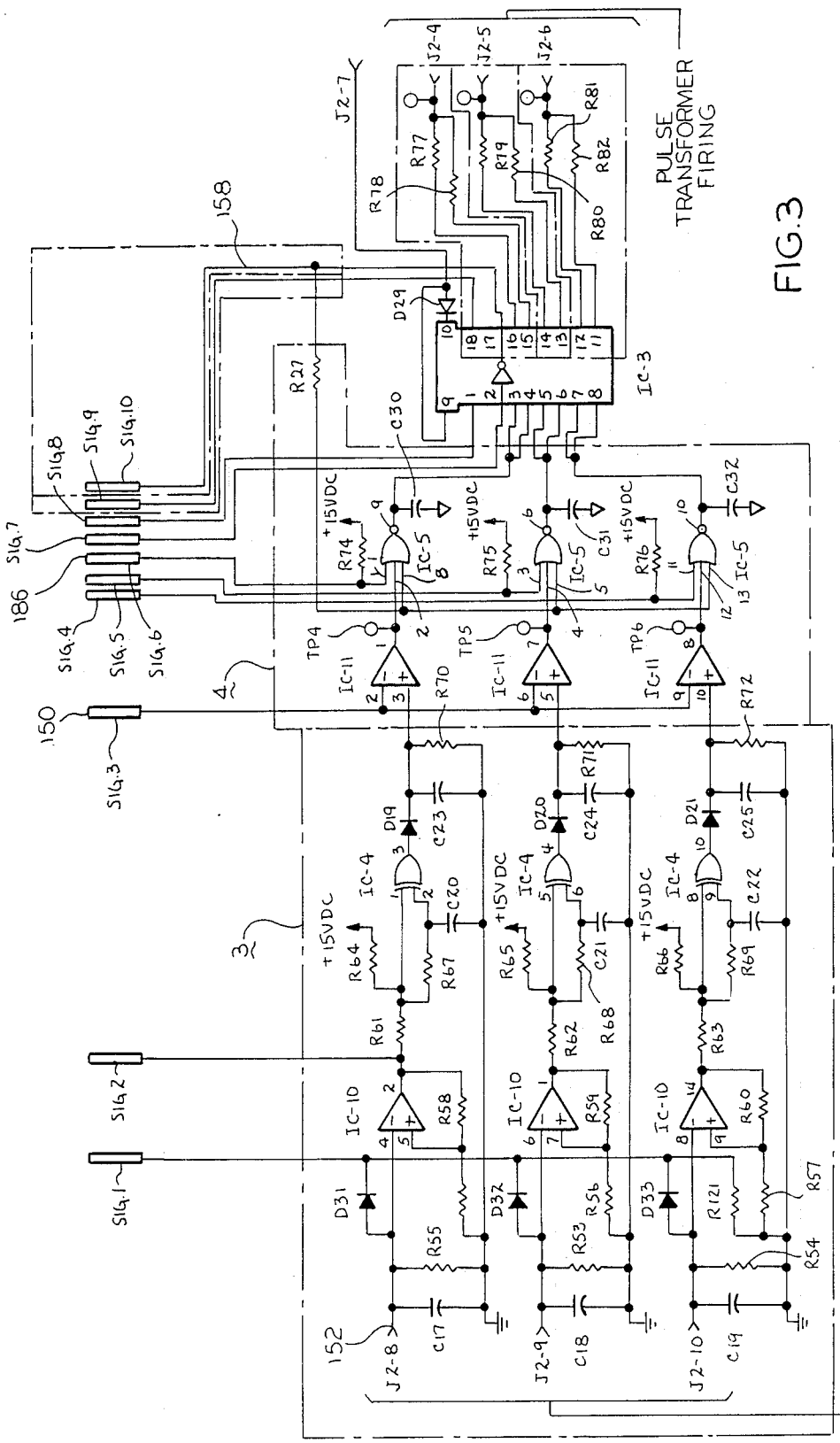
FIG. 3 is a schematic diagram showing a voltage zero crossing sensor and a phase sequence angle controller.
Figure 4:
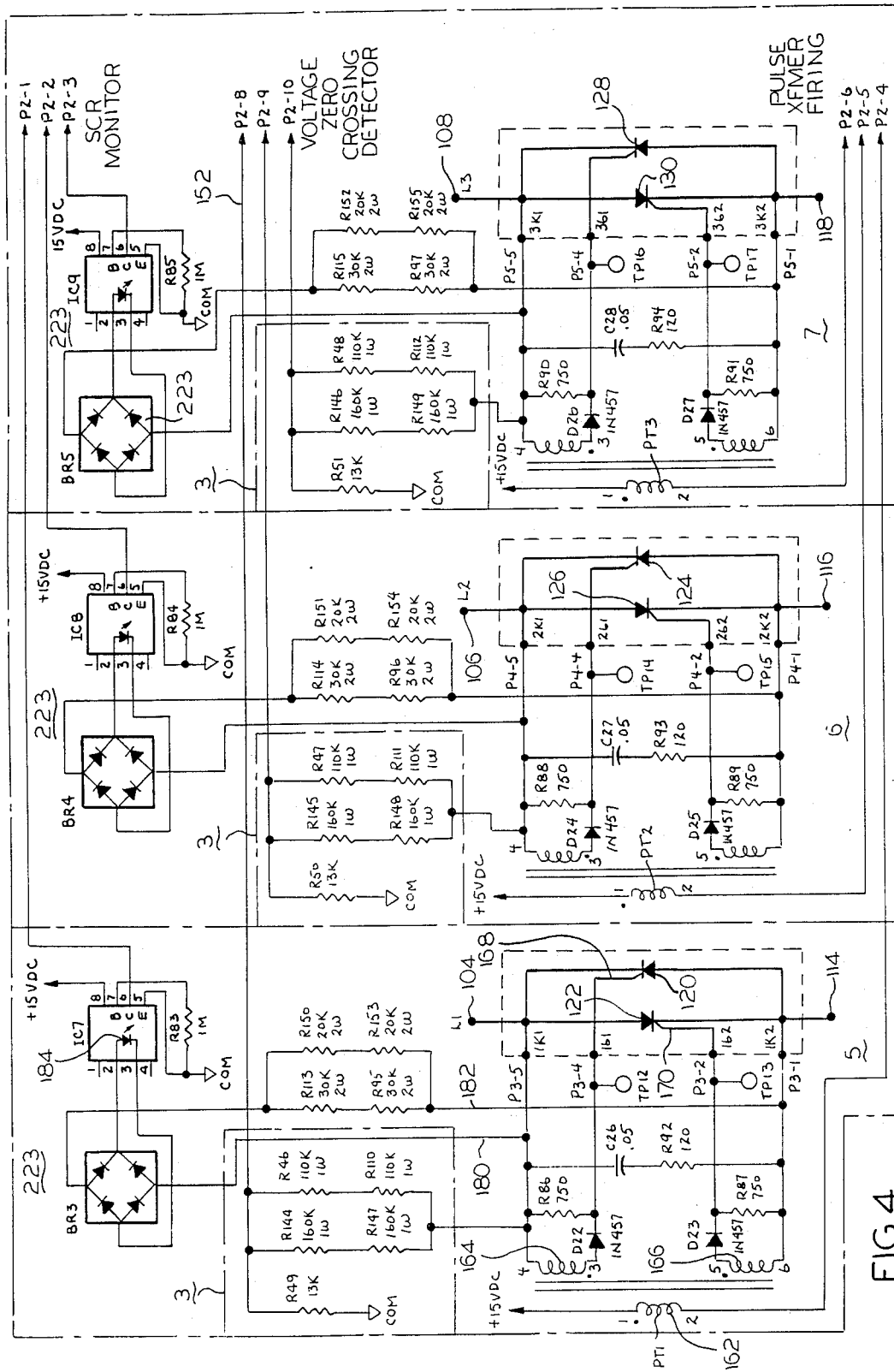
FIG. 4 is a schematic diagram showing three thyristor gate drivers and thyristor voltage sensors along with parts of a voltage zero crossing sensor.

FIG. 3 shows a schematic diagram of a major portion of voltage zero crossing sensor 3 and phase sequence angle controller 4, along with parts of thyristor gate driver voltage sensors 5, 6, 7. FIG. 4 shows part of voltage zero crossing sensor 3 along with other circuitry. In FIG. 4, the part of voltage zero crossing sensor 3 connected to line L1 at terminal 104 comprises the voltage divider network made up of resistors R144, R147, R46, R110, and R49. R49 connects at one side to common and at the other side to a node 152. Node 152 connects to plug P2-8, which in turn connects to jack J2-8 as shown on FIG. 3. Node 152 provides a voltage waveform responsive to the voltage at line L1, terminal 104, but having a maximum amplitude of approximately 10 volts. The voltage divider uses resistors R144, R147, R46, and R110 for convenience in manufacturing so that the resistance values may be altered for application to three phase lines having different voltages, and still have the voltage at node 152 have a maximum amplitude of approximately 10 volts. Filter capacitor C17, as shown on FIG. 3 is in parallel with resistor R49 and R52, and in series with resistors R144, R147, R46, and R110. Filter capacitor C17 causes a phase shift of the voltage at node 152 relative to the phase of the voltage at terminal 104. Also a time delay, leading to a phase shift, is introduced by hysteresis in the voltage zero crossing sensor IC-10. This phase shift has important consequences in the operation of the motor controller, and in particular, prevents phase control operation of the motor controller on a purely resistive load, as will be explained in greater detail hereinbelow.

Figure 13A:
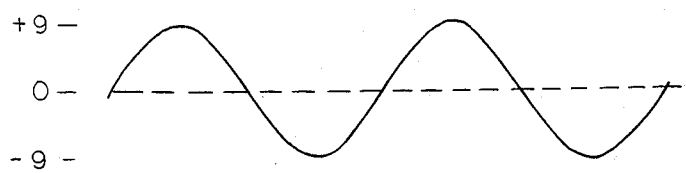
FIG. 13A–FIG. 13F are graphs showing voltage waveforms in a voltage zero crossing sensor.
Figure 13B:
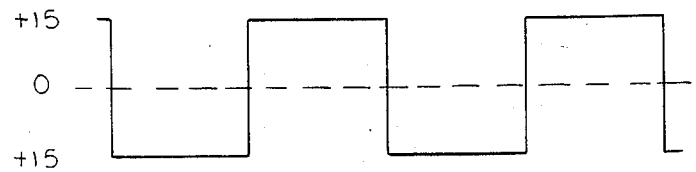

The voltage at node 152 appears at pin 4 of IC10. The output voltage of IC10 responsive to pin 4 appears at pin 2 of IC10 and is substantially a squarewave. The output voltage of IC10 at pin 2 is negative during the positive half cycle at pin 4, and is positive during the negative half cycle at pin 4. The waveforms appearing on the pins of IC10 are shown in FIG. 13A and FIG. 13B.

Figure 13C:
Figure 13D:
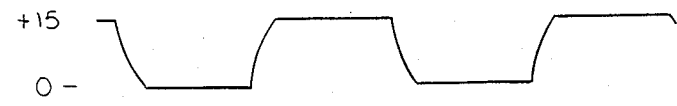
Figure 13E:
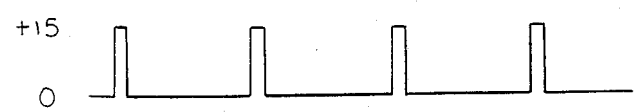

The voltage appearing at pin 2 of IC10 is connected to pin 1 of IC4 through resistor R61. Also, pin 1 of IC4 is connected to resistor R67, which in turn is connected to capacitor C20. Pin 2 of IC4 is connected to the node formed by the junction of resistor R67 and capacitor C20. The voltage waveforms appearing at pins 1 and 2 of IC4 are shown in FIG. 13C and FIG. 13D. The output of IC-4 appears at pin 3 and this waveform is shown in FIG. 13E. As can be seen from FIG. 13E, the voltage waveform appearing at pin 3 of IC4 is a short squarewave which begins at the zero crossing point of the AC voltage appearing at node 152, and ends a short time thereafter; and that short time is controlled by the time constants of resistor R67 and capacitor C20.

Figure 9:
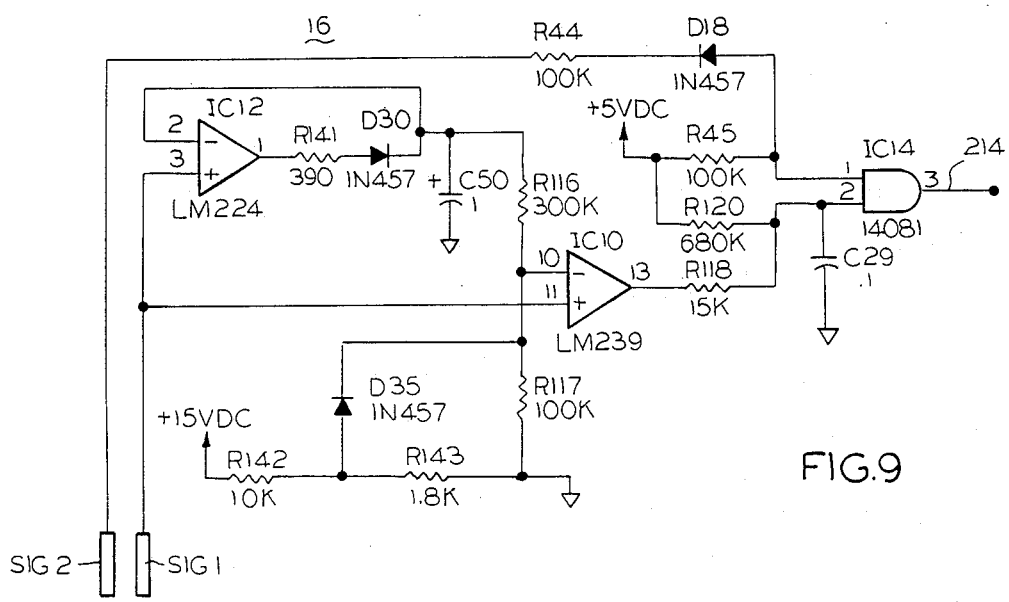
FIG. 9 is a schematic diagram showing a phase loss detector.

Signal Sig. 1 connects to node 152 through diode D31, and similarly connects to corresponding nodes of the other phases through diodes D32 and D33. Sig. 1 is a halfwave rectified 3 phase AC signal. When all three phases are present Sig. 1 does not become zero. When one phase is missing, Sig. 1 goes to zero during the AC cycle. When Sig. 1 dips below a DC level as Sig. 1 goes to zero, a sense circuit, as shown in FIG. 9, detects this event and signals the microcomputer that a phase voltage is missing.

Figure 13F:
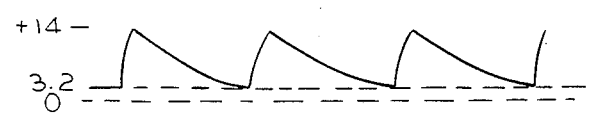

The output of IC4 appearing at pin 3 charges capacitor C23 through diode D19, and this charging occurs relatively rapidly as shown in FIG. 13F. Capacitor C23 discharges through resistor R70, and this discharge occurs relatively slowly with respect to the charging time of capacitor C23. Also, diode D19 blocks discharge of capacitor C23 through the output impedance of IC4 at pin 3.

The voltage appearing at the junction of capacitor C23 and resistor R70 is applied to pin 3 of IC11. A graph of the voltage waveform at pin 3 of IC11 is shown in FIG. 13F. The voltage applied to pin 3 of IC11 varies between approximately +3.2 volts and +14 volts. The voltage of signal 3, appearing at terminal 150 is applied to pin 2 of IC11. As noted hereinabove, signal 3 is generated by microcomputer 1 in order to control the firing phase angle of the thyristors. The voltages appearing at pins 2 and 3 of IC11 are shown in FIG. 14A. The voltage appearing at pin 3 is a sawtooth generated by the voltage on line L1 at terminal 104, but delayed in phase from that voltage by the phase shift introduced by filter capacitor C17. Hysteresis in the voltage zero crossing sensor IC-10 also introduces delay, that is an additional phase shift. The voltage applied to pin 2 is a substantially steady voltage generated by microcomputer 1. The output voltage of IC11 appearing at pin 1 is shown in FIG. 14B. The voltage at pin 1 of IC 11 makes a transition from approximately +13.5 volts to approximately 0 volts at the time that the sawtooth applied to pin 3 goes from above the steady voltage applied at pin 2 to below the steady voltage applied at pin 2, as shown by the vertical dashed line 154 connecting FIGS. 14A, 14B, 14C, and 14D.

A feedback voltage is derived from the voltage drop across thyristors 120, 122. The feedback voltage is shown in FIG. 14C, and is applied to pin 1 of IC5 to indicate the state of conduction of the respective thyristors, thyristors 120, 122. When the thyristors 120, 122 are not conducting, approximately 0 volts is applied to pin 1 of IC5, as shown in FIG. 14C. The sawtooth at pin 3 of IC11 crosses below the steady voltage at pin 2 of IC11 in order to initiate conduction of one of thyristors 120, 122 as is shown by the vertical dashed line 154. After the appropriate thyristor of thyristors 120, 122 begins conducting, the voltage at pin 1 of IC5 makes a transition to approximately +15 volts. This transition halts drive current to the gate of the appropriate thyristor by causing a transition of the voltage at pin 9 of IC5 to 0 volts, as shown in FIG. 14B. And the timing of the transition of the voltage at pin 1 of IC5 to +15 volts and the transition of the voltage at pin 9 of IC5 to 0 volts is shown by vertical dashed line 156 connecting FIG. 14C with FIG. 14D.

IC5 is a logic circuit which produces a logic high, or approximately +15 volts at its output pin, pin 9, when the input pins, pin 1, pin 2, and pin 8 are all at approximately 0 volts. Pin 8 of IC5 is held at 0 volts so long as it is desired that the motor continue running. Microcomputer 1 raises the voltage on line 158 when it is desired to stop the motor, and raising the voltage on line 158 causes pin 8 of IC5 to go to approximately +15 volts, thereby causing pin 9 of IC5 to remain at approximately 0 volts. With pin 9 of IC5 at approximately 0 volts, the thyristors 120, 122 cannot fire.

Gate drive current is supplied to both thyristors 120, 122 during the time interval that the voltage at pin 9 of IC5 is at approximately +15 volts, as shown in FIG. 14D. FIGS. 15A, 15B, 15C, 15D, and 15E give more details showing the application of gate drive current to thyristors 120, 122 as caused by pin 9 of IC5 being at approximately 15 volts.

Figure 15A:
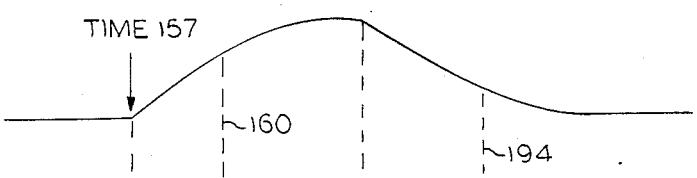
Figure 15B:
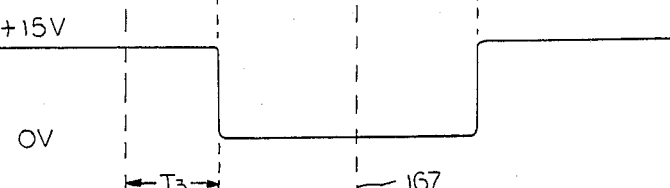

FIG. 15A shows the voltage at pin 9 of IC5, but with a much expanded time scale in comparison with FIG. 14D which also shows the voltage at pin 9 of IC5. FIG. 15A shows the voltage at pin 9 of IC5 rising slowly and falling slowly. The rise of the voltage at pin 9 of IC5 is caused by the charging time required by capacitor C30. The charging time of capacitor C30 is controlled by the output impedance of IC5 at pin 9, and the capacitance of capacitor C30. The discharge time of capacitor C30, controlling the fall of the voltage at pin 9 of IC5, is controlled by the capacitance of C30 and the total impedance into which it discharges, including the input impedance of IC5 observed at pin 9, and the input impedance of IC3 at pins 3 and 4. IC3 provides eight amplifiers, one amplifier having an input at pin 3 and an output at pin 16, and a second amplifier having an input at pin 4 and an output at pin 15. The outputs of the amplifiers having the outputs at pins 15 and 16 of IC3 are connected through resistors R77 and R78, respectively, to jack J2-4. The output voltage at pins 15 and 16 of IC3 is shown in FIG. 15B. The output voltage of IC3 at pins 15 and 16 makes a transition from +15 volts to 0 volts upon the event of the input voltage at pins 3 and 4 exceeding a threshold value, as shown by vertical dashed line 160 connecting FIG. 15A with FIG. 15B. That is, at the time of transition marked by vertical dashed line 160, pins 15 and 16 of IC3 are grounded.

Figure 15C:
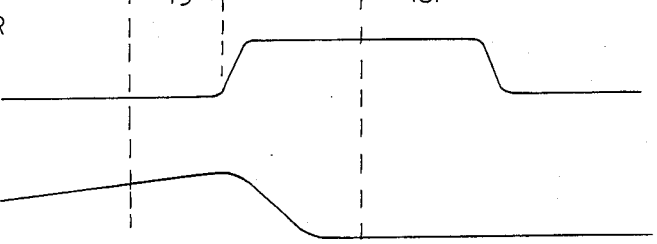

The grounding of pins 15 and 16 of IC3 causes current flow in pulse transformer PT1 shown in FIG. 4. Jack J2-4 connects to plug P2-4. A current from the +15 volt power supply flows into pulse transformer PT1 at terminal 1, through plug P2-4 into jack J2-4, through resistors R77, R78, and to ground through pin 15 and 16 of IC3. This current flow into pulse transformer PT1 at its terminal 1 is shown in the graph of FIG. 15C. Winding 162 of pulse transformer PT1 is the primary of the transformer. Current flow in primary 162, as shown in FIG. 15C, causes a corresponding current flow out of secondary 164 at its terminal 3, and also a current flow out of secondary 166 at its terminal 5, also as is indicated in FIG. 15C.

Current flow in secondary 164 out of terminal 3 passes through diode D22 and into control electrode 168 of thyristor 120. Likewise, current flow out of terminal 5 of secondary 166 passes through diode D23 and into control electrode 170 of thyristor 122. Normally, one or the other of thyristors 120, 122 will be forward biased and the other will be reversed biased by the potential difference occurring between terminals 104 and 114 caused by the voltage on three phase alternating current line L1. The forward biased thyristor will begin conducting at the initiation of current flow into its control electrode. The potential difference between line L1 and load terminal T1 will begin falling as the thyristor begins conducting, as shown by the voltage waveform shown in FIG. 15D.

A feedback circuit designed to halt current flow into the thyristor control electrode senses the voltage between terminal 104 and terminal 114, across the thyristors, through lines 180, 182. So long as the voltage between terminals 104, 114 remains large, a current flow occurs through diode bridge BR3 to light emitting diode 184. Emission of light by light emitting diode 184 causes a current flow through a phototransistor incorporated within integrated circuit IC7. Current flow through the phototransistor in IC7 maintains pin 6 of IC7 at approximately 0 volts, that is pin 6 is grounded, and also maintains plug P2-1 at approximately 0 volts. When the voltage between terminal 104 and terminal 114 drops below a value predetermined by the manufacturer of the integrated circuit IC-7, the light emitted by light emitting diode 184 drops in intensity sufficiently to stop conduction of the phototransistor incorporated in integrated circuit IC7. The potential at plug P2-1 then is pulled up to approximately +15 volts by resistor R74 shown on FIG. 3. Plug P2-1 connects to jack J2-1 shown in FIG. 2. Jack J2-1 connects to terminal 186 designated as sig. 6. Terminal 186 connects to terminal 186 shown in FIG. 3, also designated as sig. 6, which in turn is connected to pin 1 of IC5. The voltage of pin 1 of IC5 has already been discussed in conjunction with FIG. 14C, and when the voltage at pin 1 of IC5 is at approximately +15 volts no output occurs at pin 9 of IC5, thereby inhibiting gate drive to the thyristors 120, 122. Thus, when the voltage drop across terminal 104, 114 drop sufficiently to inhibit conduction of the phototransistor incorporated within integrated circuit IC7, then the voltage at plug P2-1 rises to approximately +15 volts driving pin 1 of IC5 to approximately +15 volts through the connection of resistor R74 to the +15 volt DC power supply. Conduction of the phototransistor incorporated in integrated circuit IC7 shorts plug P2-1, or sig 6, to ground thereby driving pin 1 of IC5 to approximately 0 volts, and causes a current flow from the +15 volt DC connection to resistor R74 shown on FIG. 3 to ground through the phototransistor of integrated circuit IC7.

Current flow through diode bridge BR3 is limited by the resistor network comprising resistors R113, R150, R95, and R153. The use of the resistor network simplifies manufacturing of units designed to work on different line voltages. It is necessary to adjust the load resistance of diode bridge BR3 in order to limit the maximum current flow through the bridge, and consequently through light emitting diode 184.

Figure 2:
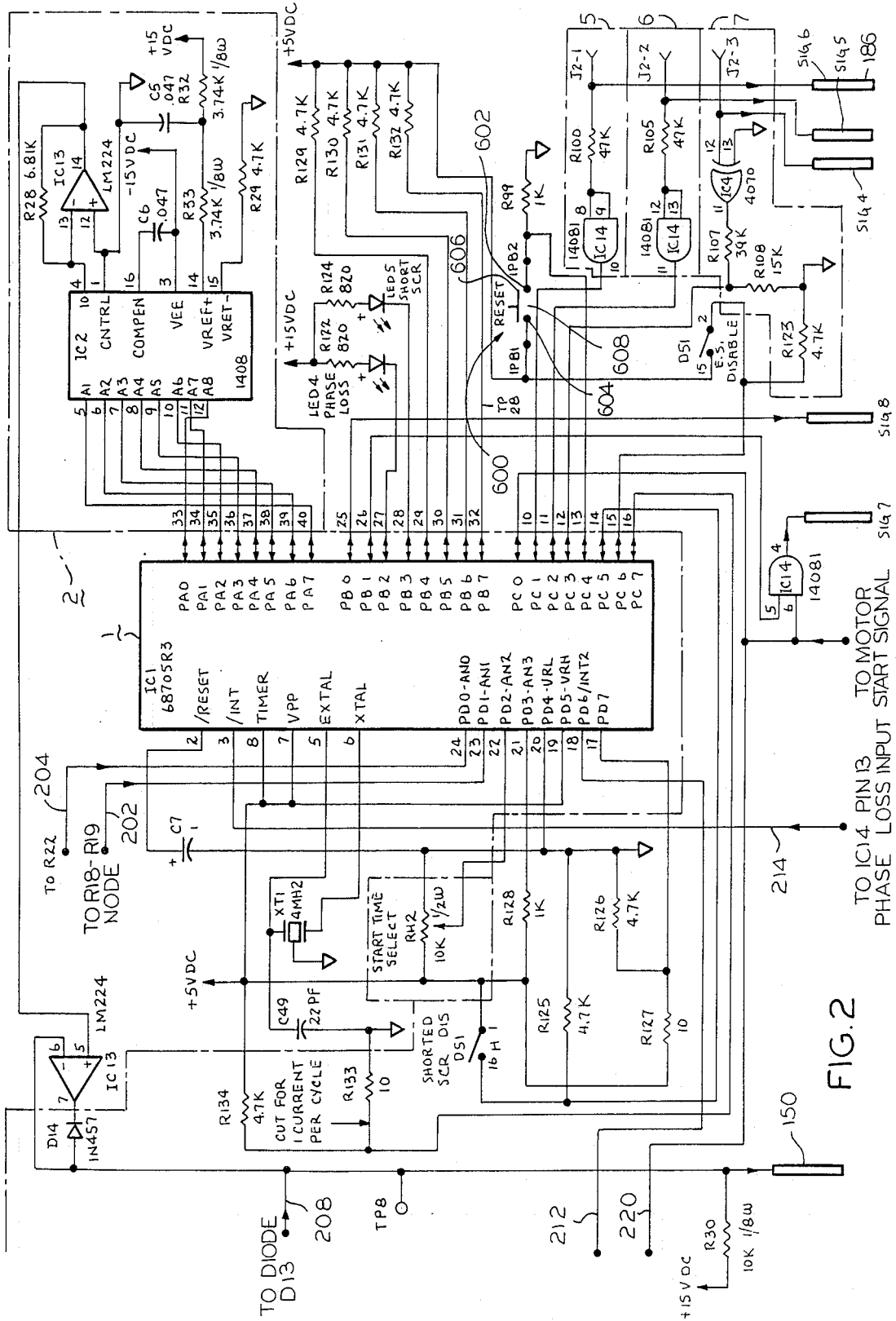
FIG. 2 is a schematic diagram showing connection of the microcomputer, and a digital to analog firing delay converter.

A "shorted thyristor" alarm circuit is shown in FIG. 2. An alarm circuit for thyristors 120, 122 is provided by jack J2-1, terminal 186, which carries a signal derived from pin 6 of IC7, the output of the phototransistor incorporated in IC7. Jack J2-1 connects to input pins 8, 9 of IC14 through resistor R100, and output pin 10 of IC14 connects to microcomputer 1 at pin 10, PC1. The software running in microcomputer 1 monitors pin 10, PC1 to check that the proper voltage variations occur across thyristors 120, 122. In the event that one of the thyristors is shorted, the expected variations will not occur, the software will detect this point, and the software will prevent the motor from starting the light a "shorted SCR" indicator lamp. Similarly, microcomputer 1 at pin 11, PC2, monitors the voltage variations occurring across thyristors 124, 126. Further, microcomputer 1 at pin 12, PC3, monitors the voltage across thyristors 128, 130.

Figure 12:
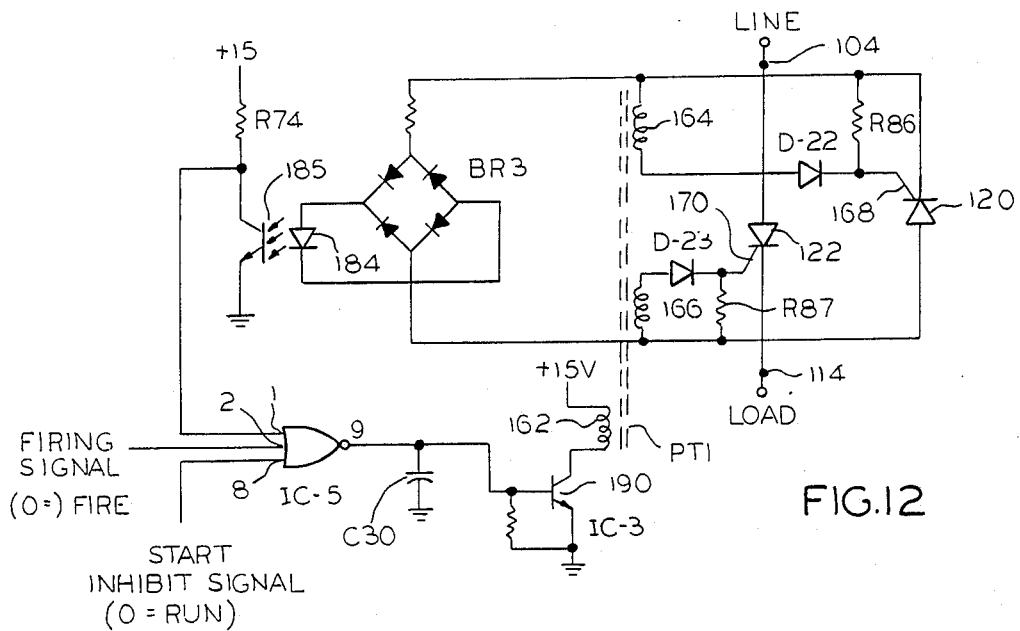
FIG. 12 is a schematic diagram showing a thyristor trigger circuit.
Figure 15D:
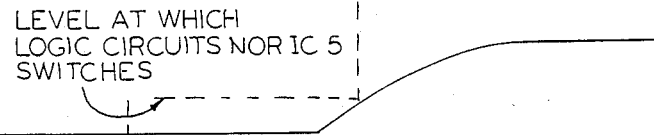

A simplified diagram of the thyristor firing control circuit is shown in FIG. 12. Reference numerals on FIG. 12 are the same as used in the previous figures. A description of the operation of the circuit will be repeated with reference to FIG. 12. A firing signal applied to pin 2 of IC5 goes to approximately 0 volts in order to initiate current flow into control electrodes 170, 168 of thyristors 120, 122. With no conduction occurring through thyristors 120, 122 the potential difference between line terminal 104 and load terminal 114 is high causing a current flow through diode bridge BR3 and consequently causing emission of light by light emitting diode 184. Emission of light by light emitting diode 184 causes conduction through phototransistor 185 contained within integrated circuit IC7. Conduction through phototransistor 185 drives pin 1 of IC5 to ground, or approximately 0 volts. Initiation of conduction into control electrodes 168, 170 occurs by driving pin 2 of IC5 to ground, as shown in FIG. 14B. Pin 9 of IC5 then rises to approximately +15 volts as shown in FIG. 14D, and FIG. 15A. As shown in FIG. 15A the voltage at pin 9 of IC5 rises slowly toward +15 volts as a result of capacitor C30 charging from the output resistance of IC5 seen through pin 9. When the voltage of pin 9 of IC5 reaches a threshold value indicated by vertical dashed line 160 in FIG. 15A, then current flow is initiated by amplifier 190 contained in IC3, as shown by FIG. 15B. Conduction through amplifier 190 in IC3 causes current flow from the +15 volt supply through primary 162 of transformer PT1, as shown in FIG. 15C. With initiation of current flow in primary 162, current flow also begins in secondary 164 and secondary 166, also shown in FIG. 15C. Current flow in secondary 164 causes current flow into control electrode 168 of thyristor 120. Current flow in secondary 166 causes current flow into control electrode 170 of thyristor 122. Conduction of the forward biased thyristor begins in response to current flow in its' control electrode. As the voltage between terminals 104 and 114 begins to drop, as shown in FIG. 15D, the current flow through diode bridge BR3 and light emitting diode 184 begins to decrease. After the light emitted by light emitting diode 184 drops below a critical value conduction in phototransistor 185 ceases, and the voltage at pin 1 of IC5 goes to +15 volts, thereby driving pin 9 of IC5 to ground and stopping conduction into control electrodes 168, 170.

The control of gate drive electrode 168, 170 by the feedback circuit comprising diode bridge BR3, light emitting diode 184, photo transistor 185, and pin 1 of the logic circuit incorporated in IC5 provides the advantage of reduced power consumption in the gate drive of the thyristors. A further advantage of this feedback circuit is found in the transition indicated by vertical line 194 connecting FIG. 15A and FIG. 15B. The voltage at pin 9 of IC5 will naturally begin to decay after pin 9 is driven to 0 by the feedback signal driving pin 1 to +15 volts. Once the voltage across capacitor C30 decays to the level shown by vertical dashed line 194 the amplifier 190 of IC3 will cease conduction thereby causing a cessation of current flow in primary 162. This action will stop current flow into thyristor control electrodes 168, 170. Diodes D22, D23 and resistors R86, R87 prevent reverse gate current when the pulse transformer is turned off.

Figure 15E:
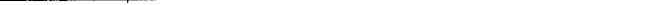

The time constant shown in FIG. 15E for the switching of phototransistor 185 results, in part, from lags within integrated circuit IC7.

Capacitor C30 provides an important function in the operation of the thyristor firing control circuit. In the absence of capacitor C30, response time of the feedback circuit is too rapid and the thyristors 120, 122 will be turned off before they are fully conducting. Thyristors 120, 122 require a predetermined time interval for which current flow therethrough must stabilize in order to achieve stable conduction. In the absence of capacitor C30 to provide a time delay in the feedback circuit, the thyristors 120, 122 will fire intermittently. The voltage between terminals 104, 114 will drop rapidly upon the initiation of firing. This rapid fall of the voltage between terminals 104, 114 will cause a rapid turnoff of phototransistor 185 thereby removing gate drive to thyristors 120, 122. In the absence of capacitor C30 to slow down the process, gate drive will be removed from thyristors 120, 122 before current flow from terminal 104 to terminal 114 becomes stabilized, and the thyristor will then self-extinguish. Self-extinguishment by the thyristors is an undesirable situation and leads to faulty operation of the motor controller. Thus, it is necessary to have a time delay in the feedback circuit such as is provided by capacitor C30. Other means of providing a time delay in a feedback circuit besides the use of an RC charging time constant as provided by capacitor C30 will be readily apparent to those skilled in the art.

A gating time of approximately 30 to 70 microseconds has been found convenient as sufficient for the length of the gating pulse to permit conduction of the thyristor to reach a stable value. However, gating time of 20 to 100 microseconds have been found to be satisfactory.

Figure 16:
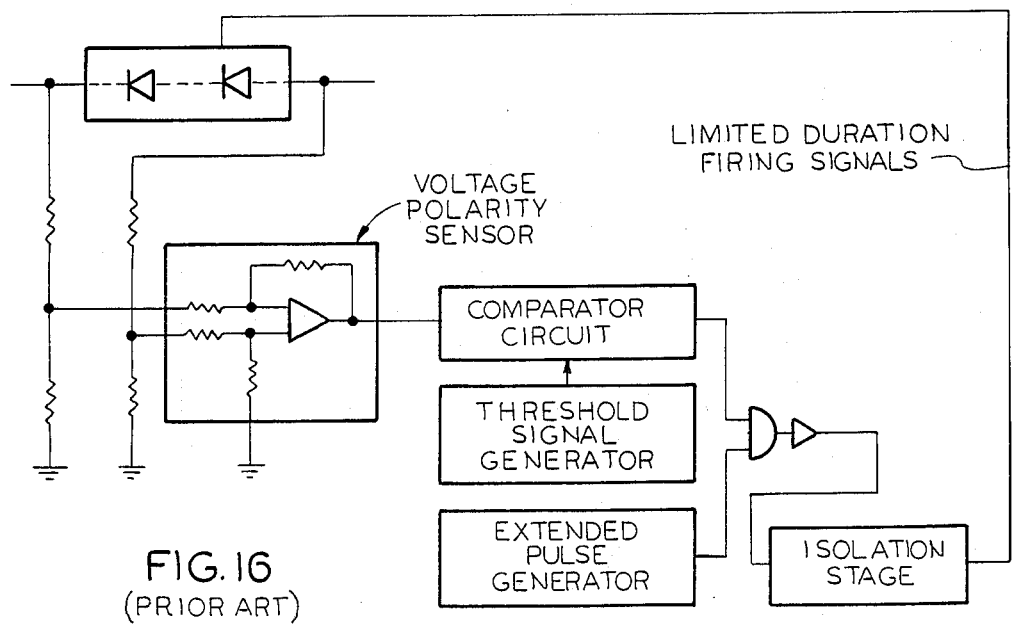
FIG. 16 shows prior art.

FIG. 16 shows a prior art disclosure for turning off gate control to thyristors connected in series after the voltage across the series reaches a predetermined value, and is taken from Pelly, et al., U.S. Pat. No. 3,728,557, issued Apr. 17, 1973. The disclosure of Pelly ignores the problem solved in the present invention by introducing a time delay in the feedback loop. Particularly, Pelly at his FIG. 2 shows a limited duration firing signal with no time delay from the event of establishing the desired voltage across his thyristor chain.

Figure 17:
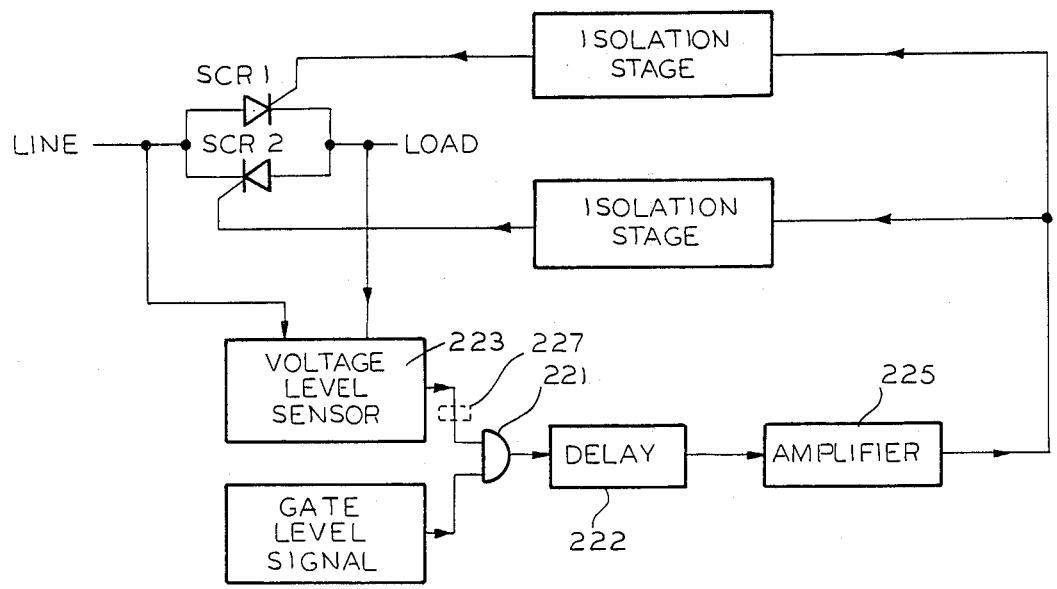
FIG. 17 is a block diagram of a thyristor trigger circuit.

FIG. 17 is a block diagram showing the present invention with the necessary delay 222 incorporated within the feedback circuit. In the detailed description of the invention, delay 222 is provided by capacitor C30 as shown in FIG. 3. C30 slows down both the buildup and fall of voltage at pin 9 of IC5.

Microcomputer Firing Angle Regulation

Microcomputer 1 produces a digital output to "digital/analog firing delay converter" 2, and this output is representative of the desired firing angle for thyristors 120, 122. A schematic diagram of digital to analog firing delay converter 2 is shown in FIG. 2. Microcomputer 1 provides output on lines PA0, PA1, PA2, PA3, PA4, PA5, PA6, and PA7, pins 33–40, to integrated circuit IC2. Integrated circuit IC2 provides an output to pin 13 of IC13. The input to pin 13 of IC13 produces an output at pin 14 of IC13. Pin 14 of IC13 is connected to pin 5 of IC13, and pins 5, 6 and 7 of IC13 along with diode D14 provide an ideal diode type circuit which drives signal sig. 3 at terminal 150. As shown in FIG. 3, terminal 150 brings signal sig. 3 to pin 2 of IC11. As further shown in FIG. 14A, the voltage level of pin 2 of IC11, as determined by the magnitude of the voltage produced by the microcomputer driving amplifier IC13 at its pin 13, determines the phase angle at which conduction is initiated in thyristors 120, 122. Thus, by the microcomputer controlling the digital output on lines PA0-PA7, the microcomputer controls the magnitude of the voltage at pin 2 of IC11, and thereby controls the phase angle at which conduction in thyristors 120, 122 is initiated.

Control and Feedback Signals

Microcomputer 1 receives inputs which determine the desired firing phase angle for thyristors 120, 122 from a number of sources, including: current peak detection and scaler circuit 9, voltage zero crossing sensor 3, current zero crossing (or reaching) sensor 11, phase loss detector 16, voltage ramp time adjustment 12, and motor start input 13.

Figure 5:
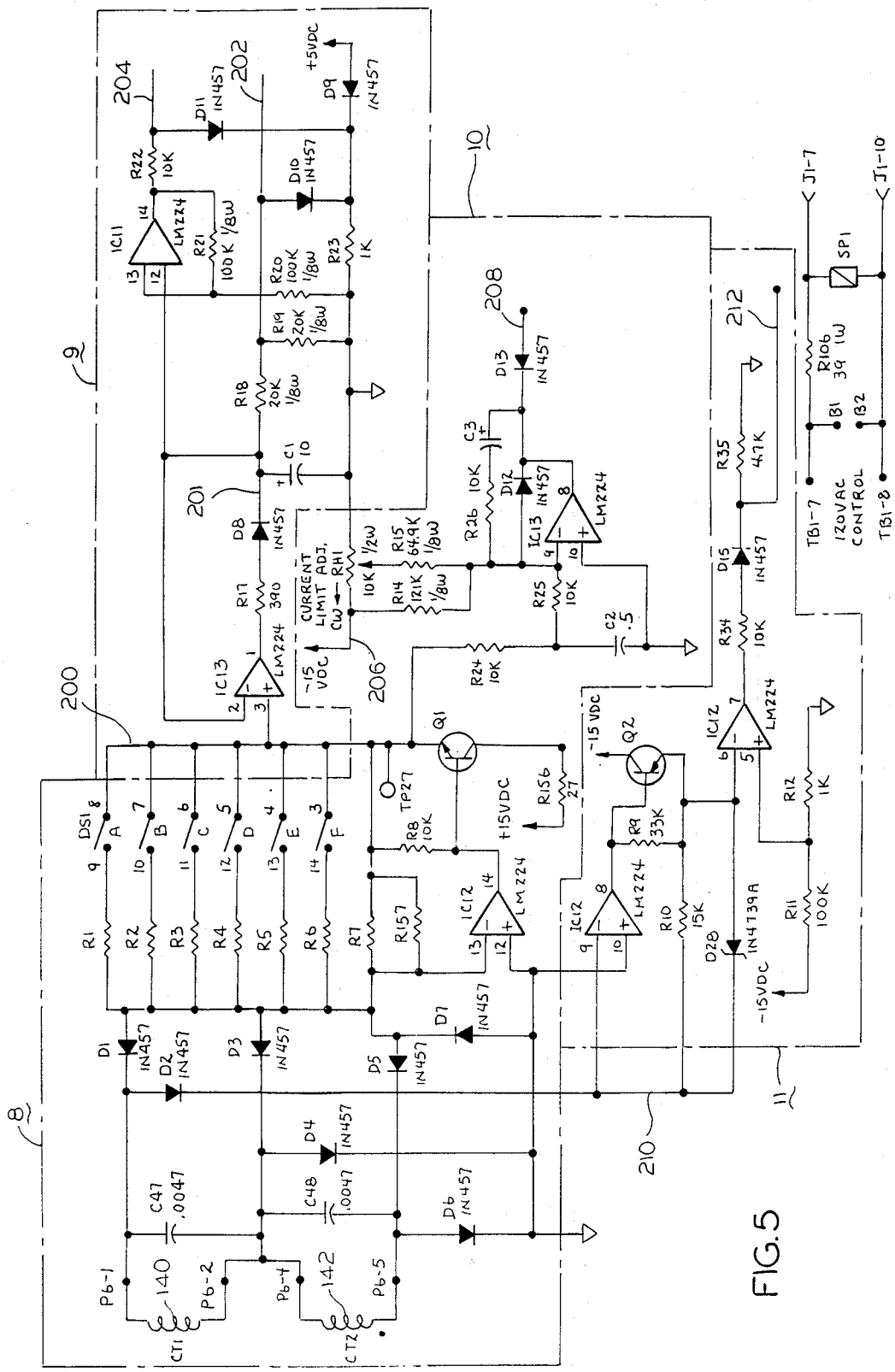
FIG. 5 is a schematic diagram showing a current to voltage converter, a current peak detector and scaler, a current limiter, and a current zero crossing sensor.

As shown in FIG. 5, current to voltage converter 8 utilizes current transformers 140, 142 to obtain a signal proportional to current flow to the load. Current to voltage converter 8 produces a voltage at line 200 which is substantially proportional to current flow to the load through load terminals 114, 116, 118. The voltage produced at line 200 may be adjusted for different load current ranges through switches DS1, A, B, C, D, E and F. Resistors R1, R2, R3, R4, R5, R6 and R7 provide current calibration.

Line 204 provides an input signal to microcomputer 1 proportional to motor current, and having good current resolution in the 100% motor full load current range. Line 202 provides a high current range for motor current to microcomputer 1. The voltage which appears at line 200 is proportional to current flow to the load, and is connected to "current peak detection and scaler" circuit 9 through pin 3 of IC13. IC13 at pins 1, 2, 3 provides an operational amplifier which drives an output on line 202, and, indirectly, an output on line 204.

IC13, at pin 1, charges capacitor C1. Diode D8 and capacitor C1 connect at node 201. Resistor R18 and resistor R19 provide a factor of 2 voltage divider to line 202. Line 202 connects to microcomputer 1 at pin 23, PD1-AN1. Pin AN1 is an analog input to microcomputer 1. Microcomputer 1 responds to voltage applied to analog input AN1 by converting a 5 volt signal to hex FF, the largest byte value, and to converting smaller voltages proportionally to smaller hexidecimal values. When the current flowing to the motor is 100% motor full load current, then the output voltage of IC13 at pin 1 drives node 201 to be approximately 1.66 volts. Thus, 100% motor full load current produces ½ of 1.66 volts, that is 0.83 volts, at line 202. The 5 volt range of microcomputer 1 at pin AN1 permits measurement of motor current up to over 600% motor full load current.

Line 204 also provides analog input representative of motor current to microcomputer 1, but provides greater precision of measurement in the vicinity of 100% motor full load current. IC11 at pin 12 accepts the voltage at node 201 as input. IC11 develops an output at pin 14 and drives line 204. Line 204 connects to microcomputer 1 at pin 24, PD0-AN0. Pin AN0 is an analog input to microcomputer 1, and microcomputer 1 generates hexidecimal values proportional to the voltage applied at pin AN0, as at pin AN1. IC11 is a voltage doubler circuit. Thus, 100% motor full load current generates 1.66 volts at node 201, and therefore generates approximately twice this voltage of 3.33 volts at line 204. Thus, the upper limit of motor full load current for analog input AN0 is approximately 150% motor full load current, as the voltage applied to AN0 reaches approximately 5 volts at 150% motor full load current.

Five volts is the maximum voltage which can be applied to microcomputer 1 at analog inputs AN0 and AN1 without danger of harming microcomputer 1. Diodes D11 and D9 provide a 5 volt clamp on line 204 to prevent damage to microcomputer 1 at pin AN0. Diodes D9 and D10 provide a 5 volt clamp on line 202 in order to prevent damage to microcomputer 1 at pin AN1.

The voltage appearing at line 200 connects to "current limit" circuit 10 through resistor R24 shown in FIG. 5, and provides input to IC13 at pin 9. Pin 9 of IC13 also receives input from the negative 15 volt power supply through resistor R14, from line 206. Current limit adjustment is provided by variable resistor RH1. When the voltage appearing at line 200, which is proportional to current flow to the load, causes pin 9 of IC13 to go positive a signal is developed on line 208 and is communicated to signal sig. 3 at terminal 150 as shown on FIG. 2. An overcurrent condition is shown by the voltage at line 200 becoming excessive, and the excessive voltage at line 200 causes pin 8 of IC13 to drive line 208 less positive. When line 208 is driven less positive, pin 2 of IC11, shown in FIG. 3, is driven less positive, thereby delaying firing of thyristors 120, 122. Pin 1 of IC11 controls pin 2 of IC5. The effect of voltage on pin 2 of IC5 on firing of thyristors 120, 122 is shown in FIG. 14B.

Current zero crossing (or reaching) sensor 11, as shown in FIG. 5, receives input on line 210. Line 210 connects to pin 9 of IC12. Pin 8 of IC12 drives transistor Q2, and transistor Q2 provides input to pin 6 of IC12. Output of IC12 at pin 7 connects to line 212. Line 212, as shown in FIG. 2, connects to microcomputer 1 at pin 18, PD6-/INT2. In the event that current flowing in line L1 between line terminal 104 and load terminal 114 reaches or crosses 0 from a negative going current flow to a positive going current flow, a logical transition occurs on line 212 thereby signalling microcomputer 1 that the event has occurred. Microcomputer 1 uses the logical transition in measuring the time between voltage zero crossing and current zero crossing, (or reaching zero).

Voltage zero crossing sensor 3, shown in FIG. 3 and FIG. 4, provides an output to phase loss detector 16 shown in FIG. 9. Phase loss detector 16 then provides an output to microcomputer 1. As shown in FIG. 3 and FIG. 9, phase loss detector 16 is coupled at signal Sig. 1 to node 152 through diode D31. Sig. 1 includes a portion of the signal shown in FIG. 13A, which is the voltage at pin 4 of IC10. Also, portions of signal Sig. 1 include voltages proportional to that appearing at line L2 through jack J2-9 and diode D32, and the voltage appearing at line L3 through jack J2-10 through diode D33. Referring to FIG. 9, sig. 1 connects to pin 3 of IC12 and pin 11 of IC10. IC12 drives pin 10 of IC10. The output of IC10 appears at pin 13 and is connected to IC14 at pin 2. As shown in FIG. 3, sig. 2 is taken from pin 2 of IC10, and that voltage is shown in FIG. 13B. Sig. 2 is negative 15 volts during positive half cycles at node 152 and is +15 volts at negative half cycles at node 152. Sig. 2 is connected through diode D18 to pin 1 of IC14. The output of the logic comparison of pin 1 and pin 2 of IC14 occurs at pin 3 of IC14. Pin 3 of IC14 makes a transition when node 152, derived from line L1, crosses through 0 from negative voltage to positive voltage. This transition is connected by line 214 from pin 3 of IC14 to microcomputer 1 at pin 3,/INT. Microcomputer 1 recognizes the transition at IC14 pin 3 and begins timing the interval between the event of the voltage at node 152 crossing 0 from negative values to positive values until the occurrence of the event of the current of line 1 crossing 0 (or reaching 0), from negative values of current to positive or zero values of current as indicated on line 212. The voltage zero crossing detected at pin 3,/INT of microcomputer 1 starts a timer incorporated within microcomputer 1, and the current zero crossing (or reaching zero) detected at pin 18, PD6-/INT2 of microcomputer 1 causes reading of the timer. The time interval measured by the timer is the current lag. The current lag is measured to an accuracy of approximately 16 microseconds, or 0.35 electrical degrees at 60 Hz.

Voltage ramp time adjust 12 is controlled by variable resistor RH2 as shown in FIG. 2. Variable resistor RH2 is connected from +5 volts DC to ground. The variable arm of the resistor is connected to microcomputer 1 at pin 22, PD2-AN2. Adjustment of the voltage on pin 22 of microcomputer 1 permits determination by microcomputer 1 of the desired time interval for a soft start of the motor operated by the motor controller.

Start, Stop, and Fault Detection

Figure 6:
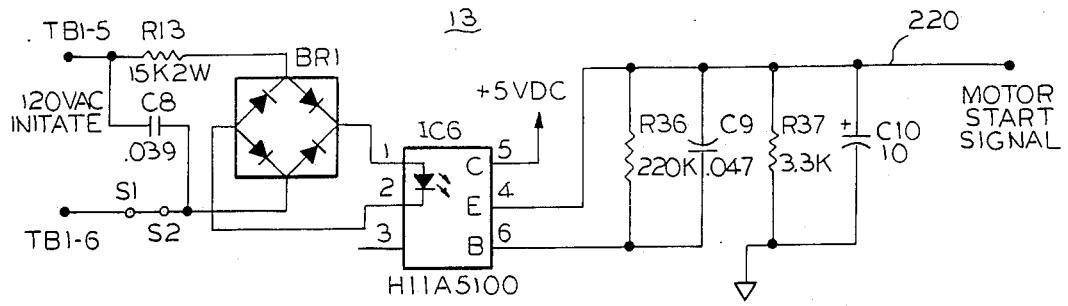
FIG. 6 is a schematic diagram showing a motor start input.

Motor start input 13 is shown in FIG. 6. The application of 120 volts AC between terminals TB1-5 and TB1-6 initiates starting of the motor. The application of 120 volts between terminals TB1-5 and TB1-6 causes current flow through diode bridge BR1. Diode bridge BR1 drives opto-isolator IC6. Opto-isolator IC6 develops a +5 volt DC voltage on line 220. As shown in FIG. 2, line 220, connects to microcomputer 1 at pin 9, PC0.

Figures 7, 8:
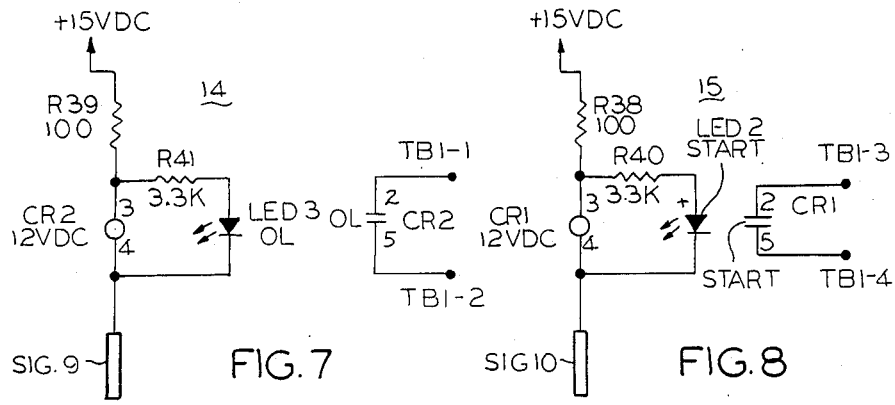
FIG. 7 is a schematic diagram showing part of an alarm relay driver.
FIG. 8 is a schematic diagram showing part of a start interlock driver and start inhibit.

Alarm relay driver 14 is shown in part in FIG. 7. Microcomputer 1 provides output at pin 25, PB0, on a line marked sig. 8. Sig. 8 is amplified by IC3 as shown in FIG. 3 at input terminal 1 and output terminal 18. Output terminal 18 of IC3 connects to a line indicated as sig. 9. Sig. 9 connects to alarm relay driver 14 as shown in FIG. 7. Sig. 9 goes to ground in the event of an alarm, thereby causing LED 3 to conduct and emit light, and pick up an alarm relay. Emission of light by LED 3 is indicative that an alarm condition has occurred.

"Start interlock driver and start inhibit circuit" 15 is shown in part in FIG. 8. Line 220 provides a +5 volts signal from motor start input 13, and this +5 volt signal connects to start interlock driver 15 through connection to IC14 at pin 6 as shown in FIG. 2. IC14 provides a logical AND of signals from motor start 13 and microcomputer 1. Thus, the controller can be turned OFF even if a malfunctioning microcomputer tries to keep it on. And IC14 provides an output at pin 4 connected to a line identified as sig. 7. Sig. 7 is amplified by IC3 as shown on FIG. 3 at input terminal 2 and output terminal 17. Output terminal 17 of IC3 connects to a line identified as sig. 10. Sig. 10 is connected to "start interlock driver and start inhibit" 15 as shown in FIG. 8. Conduction through line sig. 10 causes LED 2 to emit light and indicate that the motor is started and running, and also causes an interlock relay to be picked up.

Figure 10:
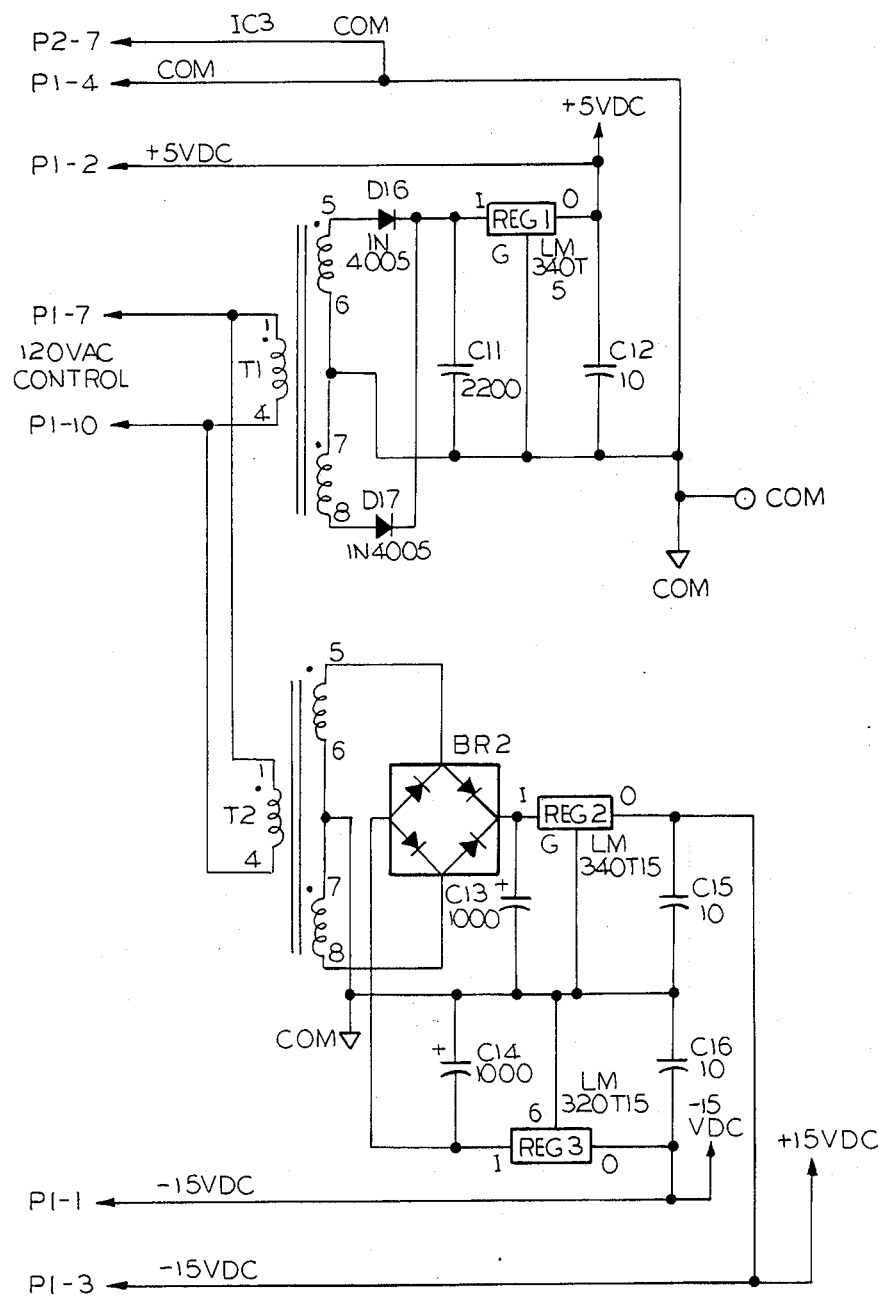
FIG. 10 is a schematic diagram showing a power supply.

Power supply 17 is shown in FIG. 10. 120 volt AC control power is applied at plug P1-7 and P1-10. Power supply 17 supplies the voltages necessary to operate the motor controller.

It has been found desirable to take measures to suppress transient noise at terminals of the integrated circuits. Capacitors were connected between the power supply terminal of the integrated circuit and the ground terminal of the integrated circuits. The capacitors are placed as close as possible to the terminals of the integrated circuit. On the positive 5 volt DC power supply capacitors were placed on integrated circuit IC1 between terminals 4 and 1, on integrated circuit IC2 between terminals 13 and 2, and on integrated circuit IC14 between terminals 14 and 7. On the +15 volt DC power supply, capacitors were placed on integrated circuit IC4 between terminals 14 and 7, IC5 between terminals 14 and 7, and IC11 between terminals 4 and 11. On the integrated circuits requiring both +15 volts DC and −15 volts DC, capacitors were placed on integrated circuit IC10 between pins 3 and 12, IC12 between pins 4 and 11, and IC13 between pins 4 and 11.

Figure 11:
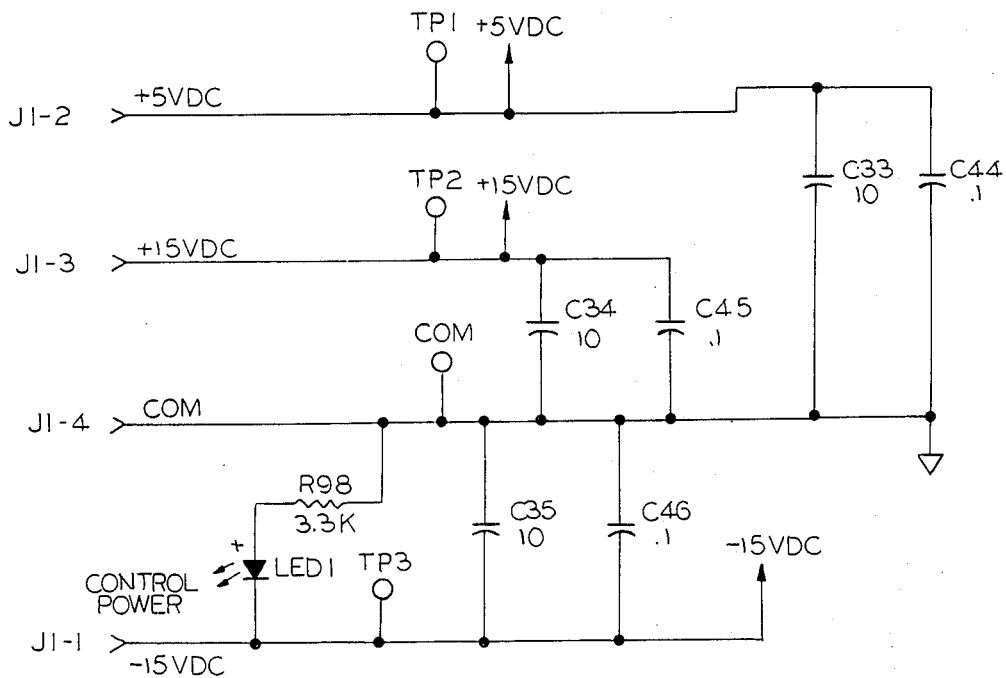
FIG. 11 is a schematic diagram showing various noise filtering circuits.

FIG. 11 shows the application of power to jack J1, where connection J1-1 carries −15 volts DC, connection J1-2 carries +5 volts DC, and connection J1-3 carries +15 volts DC. Light emitting diode LED1 indicates the presence of −15 volts DC at jack connection J1-1.

Operation for alternating current lines L2 and L3 of the voltage zero crossing sensor 3 and the phase sequence angle controller 4 is shown in the above mentioned figures. In particular, operation of the circuit for line L2 is brought into the schematic shown in FIG. 3 at jack J2-9. And the signal for operation of the circuit for line L3 is brought into FIG. 3 at connection jack J2-10. Operation of the circuit for the lines L2 and L3 is similar to the operation for line L1, as described in detail hereinabove. Operation for the lines L2 and L3 will be readily apparent to those skilled in the art on the basis of the description given hereinabove for line L1.

Software

Main Program

Figure 18A:
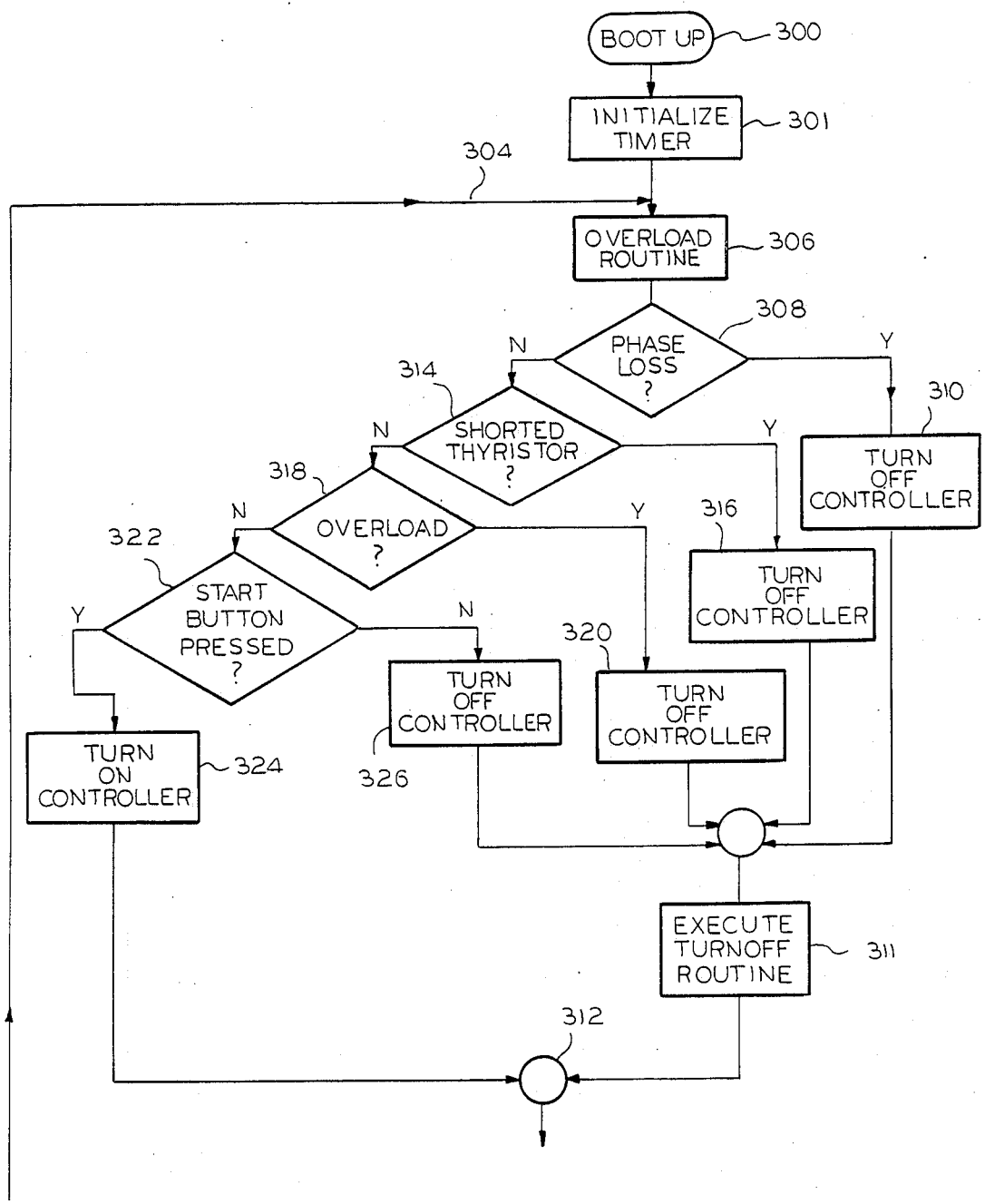
FIGS. 18A and 18B are flow diagrams of a computer program for a motor controller.
Figure 18B:
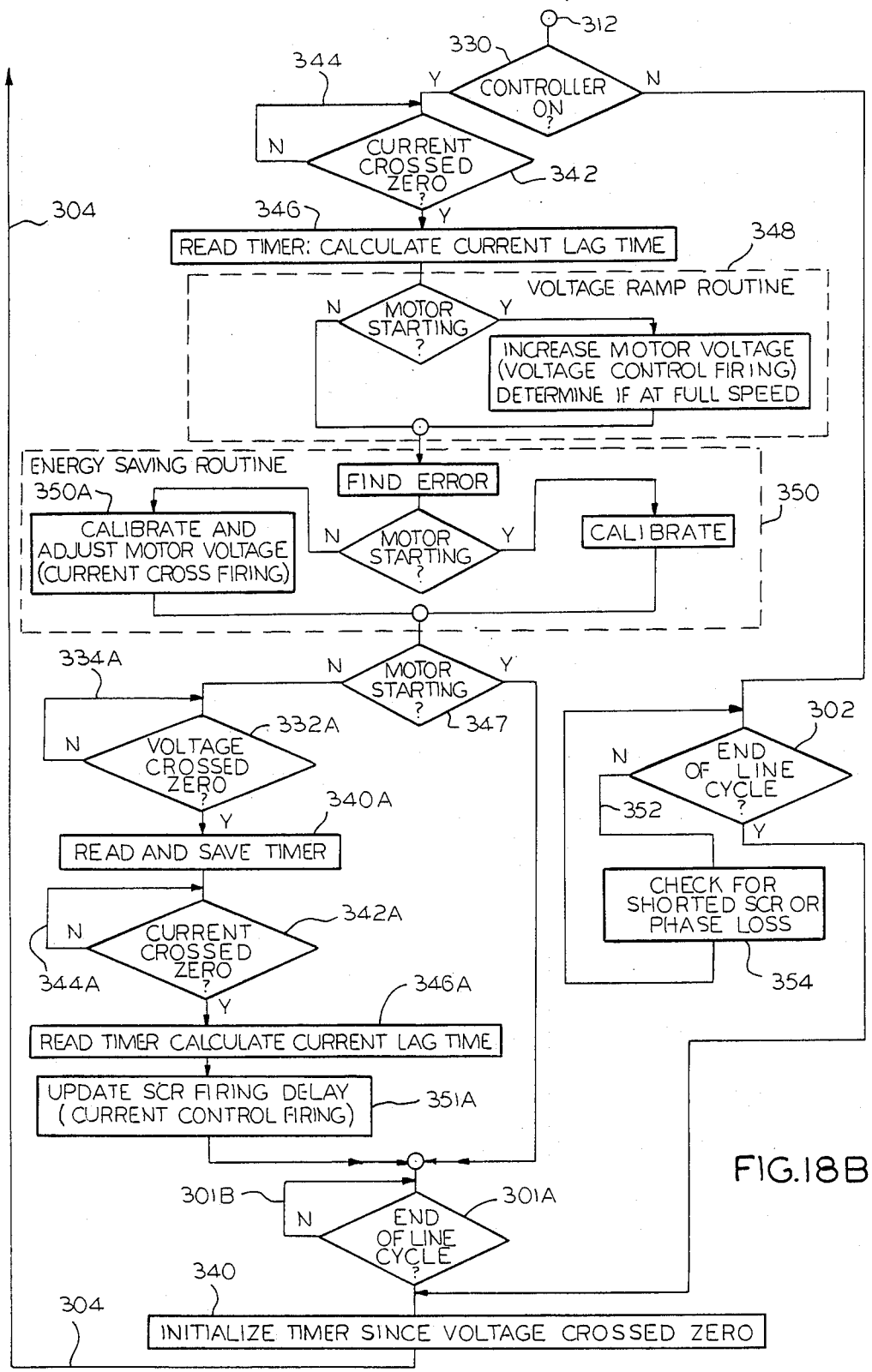

FIGS. 18A and 18B give a flow diagram of a computer program for operation of microcomputer 1. "Boot up" block 300 is activated when 120 volts AC control power is applied to power supply 17, as shown in FIG. 1. The program proceeds to "initialize timer" block 301 where the event of the voltage on line L1 crossing zero is used to initialize a timer. The program then passes through the various functional blocks shown in FIGS. 18A and 18B until it reaches the "end of line cycle" block 301A or block 302. After the present line cycle ends, the program then uses the event of the voltage on line L1 crossing zero from a negative value to a positive value, to initialize a timer at "initialize timer" block 340. After initializing the timer, the program returns on line 304, and again passes through the functional blocks shown in FIGS. 18A and 18B. The program continues returning on line 304 at the end of each line cycle, or 60 times per second on a 60 Hertz power line, and 50 times per second on a 50 Hz power line, so long as control power is supplied to power supply 17.

On either boot up or return at the termination of a line cycle, the program first passes to "overload routine" block 306. "Overload routine" block 306 is discussed in greater detail hereinbelow with reference to FIG. 21. The program passes through overload routine 306 and enters "phase loss" block 308. In the event that microcomputer 1 senses a loss of voltage on one of the power lines L1, L2, or L3, then the program branches to "turn off controller" block 310, turns off the controller, does "execute turn off routine" block 311, and then exits to point 312.

In the event that no phase loss is sensed, the program branches to "shorted thyristor" block 314. In the event that microcomputer 1 senses that a thyristor is shorted, the program branches to "turn off controller" block 316, turns off the controller and does "execute turnoff routine" block 311, and then goes to point 312.

In the event that no shorted thyristor is sensed, the program goes to "overload" block 318. In the event that an overload has been sensed in the overload routine, the program branches to "turn off controller" block 320, turns off the controller, and does "execute turnoff routine" block 311, and goes to point 312.

In the event that no overload condition is sensed, the program goes to "start button pressed" block 322. In the event that the start button is either pressed or interlocked into the "on" position, then the program branches to "turn on controller" block 324 and proceeds to point 312. In the event that the start button is not pressed or interlocked "on", the program branches to "turn off controller" block 326, does "execute turnoff routine" 311, and then proceeds to point 312.

Current Lag Measurement

Upon reaching point 312, the program executes "controller on" decision block 330, and if the controller is not ON goes to the "end of line cycle" decision block 302. In the event that the controller is ON, the program goes to the "current crossed 0" decision block 342. The program continues executing loop 344 until the current in line L1 reaches 0 by approaching 0 from a negative current value towards a positive current value.

Upon the event of the current in line L1 reaching 0, from a negative current value to a positive or zero current value, the program goes to "read timer: calculate current lag time" block 346. In block 346, the program stores a numerical value representative of the time interval between the event of the voltage crossing 0, as determined by the "end of line cycle" blocks 301, 301A, or 302, and the event of the current reaching 0. This time interval records the "present current lag" in three phase power line L1.

Current flow in the power lines L1, L2, L3 does not "cross" zero with the AC cycle because of the action of the thyristors. The current reaches zero and the conducting thyristor turns OFF. The oppositely connected thyristors in that line then does not turn ON until it receives a gate pulse. Thus, there will generally be an OFF TIME for current flow between the event of the current reaching zero in the AC cycle and the event of the next gating pulse arriving at the "other" thyristor in that line.

Voltage Ramp and Energy Saving

After executing block 346 the program goes to "voltage ramp routine" block 348. "Voltage ramp routine" block 348 slowly increases the voltage on the load during the starting phase in order to provide a "soft start" for the motor. "Voltage ramp routine" block 348 will be discussed in greater detail hereinbelow with regard to FIG. 22.

Upon completion of "voltage ramp routine" block 348 the program goes to "energy saving routine" block 350. In the event that the motor is running and the "up to speed" flag is set when this block is reached, the program reduces the voltage applied to the motor when the motor is lightly loaded in order to maintain the power factor in an efficient operating range so as to save electrical energy in the operation of lightly loaded motors. "Energy saving routine" block 350 will be discussed in greater detail hereinbelow with reference to FIGS. 27 and 28.

Upon completion of the "energy saving routine" block 350 the program goes to "motor starting" decision block 347. In the event that the motor is starting, the program goes to "end of line cycle" block 301A where the program waits for the end of the line cycle by executing loop 301B. Upon the detection of the end of the present line cycle, the program proceeds to "initialize timer" block 340, initializes the timer to indicate that the voltage on line L1 crossed zero from a negative value to a positive value, and then returns to "overload routine" block 306 by path 304 and begins operation during the next line cycle.

Returning to the discussion of "motor starting" block 347, in the event that the motor is running and the "up to speed" flag is set when this block is reached, the program proceeds to the "voltage crossed zero" decision block 332A. The program waits in the "voltage crossed zero" decision block 322A by executing loop 334A until the voltage in line L1 does a cross zero in going from a positive voltage value to a negative voltage value. Once the line L1 voltage crosses zero, the program goes to "read and save timer" block 340A. From the "read and save timer" block 340A the program goes to "current crossed zero" decision block 342A. The program continues executing loop 344A until the current in line L1 crosses zero, or reaches zero, from a positive current value to a negative or zero current value. Upon the event of the current in line L1 crossing zero, or reaching zero, from a positive current value to a negative or zero current value, the program goes to "read timer and calculate current lag" block 346A. In block 346A, the program stores a numerical value representative of the time interval between the event of the voltage in line L1 crossing zero from a positive voltage value to a negative voltage value, and the current in line L1 crossing zero, or reaching zero, from a positive current value to a negative or zero current value. This records the "present current lag" for the second half cycle in power line L1. The program then proceeds to the "update SCR firing angle (current control firing)" block 351A.

Upon completion of block 351A the program goes to "end of line cycle" block 301A, and waits until the end of the present line cycle by testing for the event of the voltage on line L1 crossing zero through executing loop 301B. After the present line cycle ends, the program proceeds to "initialize timer" block 340, initializes the timer in response to the voltage on line L1 crossing zero or reaching zero from a negative value to a positive value, returns on line 304, and again passes through the functional blocks shown in FIGS. 18A and 18B.

Block 346 measures "present current lag" as voltage and current pass zero from a negative value to a positive value, and one half cycle later block 346A measures "present current lag" as both voltage and current reach zero from positive values while heading toward negative values.

Current Control Firing

"Current control firing" is defined as timing thyristor firing from the event of current in line L1 reaching zero. "Update SCR Firing Delay (current control firing)" block 351A implements "current control firing" by using microcomputer 1 to calculate Signal 3 as a thyristor firing control voltage, and applying Signal 3 to hardware that times thyristor firing relative to the event of the voltage on each respective line crossing zero. Also, "Energy Saving" Block 350 at its internal block 350A, implements current control firing in the same way as does block 351A.

Figure 27:
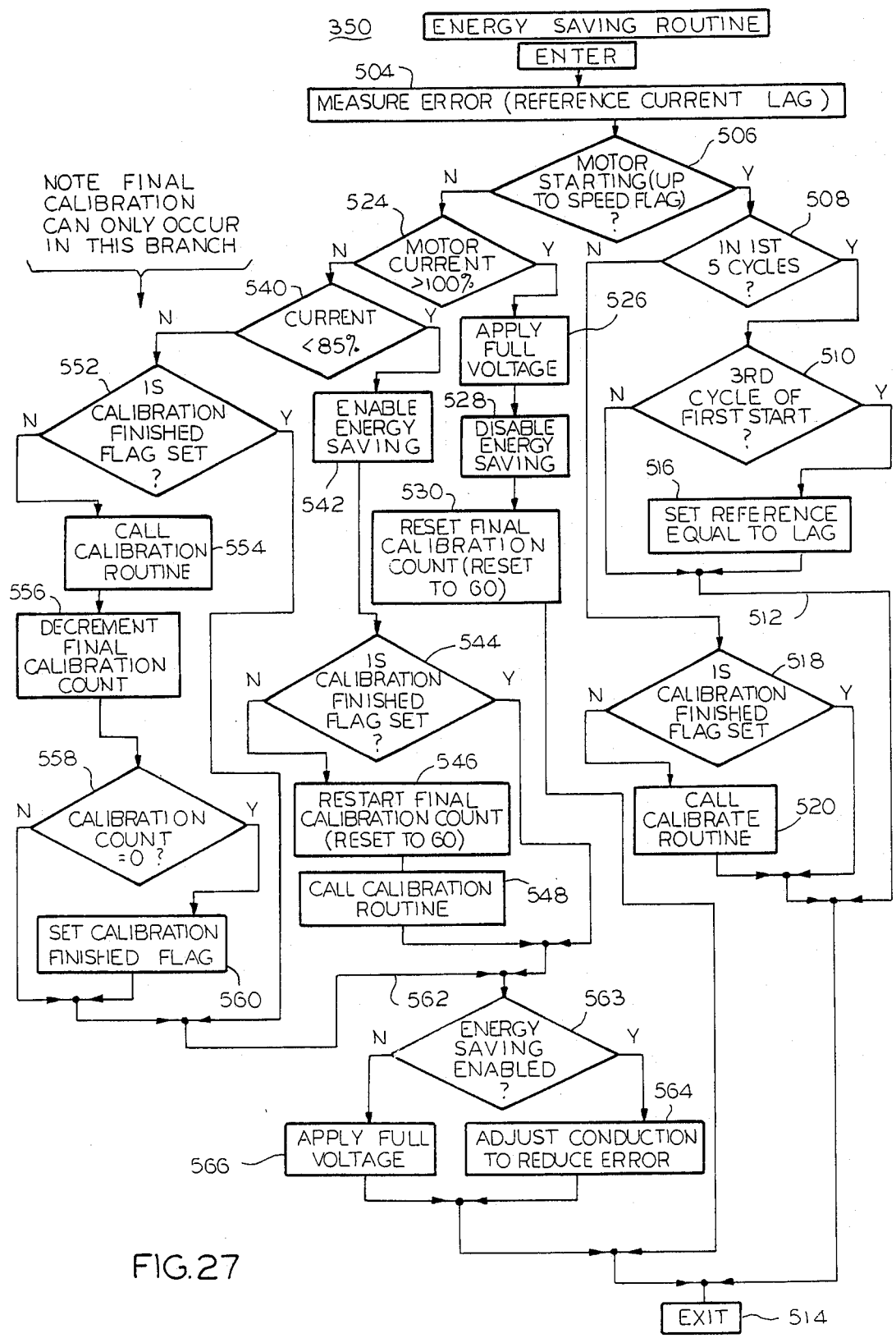
FIG. 27 is a flow diagram for an energy saving routine.

The implementation of current control firing may be understood by reference to FIGS. 19A, 19B, and 20. Referring to FIG. 19: T1 is the measured lag of the current as determined by block 346 and block 346A; T2 is the "firing delay" determined by Signal 3 interacting with the hardware; and T3 is defined as the "off time". The "off time" is calculated by the "energy saving routine" block 350 in order to achieve efficient operation of a lightly loaded motor, as will be more fully disclosed hereinbelow with reference to FIGS. 27 and 28. "Efficient operation" is achieved by reducing the voltage applied to the motor so as to achieve a "full load" power factor for an underloaded motor. The "off time" T3 is calculated at block 564, "Adjust Conduction to Reduce Error", as is shown in FIG. 27.

"Current control firing" is achieved by block 350A and block 351A by adding the "off time" T3, chosen by "energy saving routine" block 350 at block 564, to the "measured lag", where the "measured lag" is determined by "read timer" block 346 or block 346A. Signal 3 is outputted by microcomputer 1, and is adjusted to give a firing angle calculated by the following equation:

$$\frac{\text{firing}}{\text{angle}} = \frac{\text{measured}}{\text{lag}} + \frac{\text{off}}{\text{time}}$$

The calculation of "firing angle" T2 by microcomputer 1 can be expressed as:

T2=T1+T3

The "measured lag" T1 is measured twice each AC line cycle by blocks 346 and block 346A. The "off time" T3 is set by the energy saving routine in order to achieve a desired "measured lag" T1. The microcompter 1 simply adds the values of T1 and T3 to obtain T2.

Microcomputer 1 adjusts Signal 3 so that the hardware, "phase sequence/angle controller" block 4, shown as a schematic in FIG. 3, fires the thyristors at a time that a signal proportional to the phase angle of the line voltage crosses Signal 3, as determined by integrated circuit IC-11 at pins 1, 2, 3 for one phase, at pins 5, 6, 7 for a second phase, and at pins 8, 9, 10 for a third phase.

"Current control firing" is achieved by the combination of microcompter 1 adding the "measured lag" to the desired "off time", from that sum calculating Signal 3, and Signal 3 controlling the circuit, shown in FIG. 3, which generates gate signals when a voltage proportional to line voltage phase angle crosses Signal 3. FIG. 19B shows these timing relationships, as does FIG. 14A.

An advantage of "current control firing" of thyristors is that it provides more stable motor operation than does voltage control firing.

The voltage applied to the motor is the primary independent variable in timing the firing of the thyristors using the circuit shown in FIG. 3. Current control firing is achieved by the calculation of "firing delay" T2. The thyristors are fired at a time T2 after the voltage, in each respective line, applied to the motor crosses zero. The energy saving routine determines that firing should occur at "OFF TIME" T3 after the current reaches zero.

Block 351A provides a second measurement of the "present current lag" after a cycle through the "energy saving routine" block 350 and block 350A. This second measurement of lag and updating of the SCR firing angle twice during each AC line cycle leads to greater stability in operation of the motor. "Energy saving routine" block 350 changes the "off time" T3, and updating the SCR firing angle twice during one change in the "off time" keeps the current control firing up-to-date. By updating the SCR firing angle using two measured values of the current lag during each cycle of changing the "off time", the apparatus is better able to dampen out fluctuations in motor speed.

In FIG. 14A, 14B, 14C, and 14D the current cross firing parameters T1, T2, and T3 are shown. The sawtooth wave shown in FIG. 14A is reset at time 155 when the voltage crosses zero. Also, the comparator goes to logical HIGH at time 155 when the voltage crosses zero as shown in FIG. 14B. The feedback from the "shorted SCR detector" shown in FIG. 14C goes to logical low when the current through the thyristor reaches zero at time 157. Thus, the time interval T1 is measured from the reset of the sawtooth wave at time 155 to the "HIGH to LOW" transition of pin 1 of IC5 as shown in FIG. 14C.

The thyristor firing signal is generated at the time that the sawtooth wave crosses Signal 3, and is indicated by dashed line 154. Thus T3 is the time interval from time 157 to time 154. Gate drive to the thyristors is initiated at time 154. The voltage across the thyristor pair then once again collapses as the thyristor turns ON, causing the "shorted SCR detector" to drive pin 1 of IC-5 from LOW to HIGH at time 156. Gate current flow to the thyristor pair is shown in FIG. 14D as existing between time 154 and time 156.

Advantages of Current Control Firing

Current control firing of the thyristors gives stability through negative feedback in the event that fluctuations occur in the motor speed. For example, if the motor speed should fluctuate and the motor begins to run more slowly, then the "measured lag", T1 of FIG. 19, will decrease. The desired "off time" T3 will remain substantially constant as it is set by the energy saving routine, and the energy saving routine responds slowly to changing conditions. So the sum T2 will decrease with the decrease in T1. The decrease in T2, the "firing delay", increases the voltage applied to the motor, thereby counteracting the fluctuation causing the motor to run more slowly. The motor voltage increases when T2, the "firing delay", decreases because the time duration of thyristor conduction is increased.

Also, an increase in motor speed will be accompanied by an increase in "measured lag" T1. T3 will remain substantially constant, leading to an increase in "firing delay" T2. The increase in "firing delay" T2 causes a decrease in motor voltage by causing a decrease in conduction time for the thyristors, and thereby counteracts the fluctuating increase in motor speed.

The response time of "firing delay" T2 to fluctuations in motor speed is very short because the value of T2 is recalculated twice each AC line cycle when the "present lag" T1 is measured. And the value of Signal 3 is also recalculated twice each AC line cycle.

In contrast to the present method of using current control firing, there have been employed in the past various methods of controlling firing of thyristors using timing from the event of line voltage crossing zero. In these methods, when energy saving is implemented, an energy saving routine selects the firing delay T2 in order to achieve a desired "measured lag" T1. When T2 is fixed by the "energy saving" routine, it cannot change with motor speed fluctuations because it is changed slowly by the energy saving routine. A substantially fixed value of firing delay T2 leads to unstable motor speed variations as a result of ordinary speed fluctuations. For example, a decrease in motor speed will be accompanied by a decrease in measured lag T1, but firing delay T2 will remain constant. The "current curve" in FIG. 19A will shift to the left, and so current will flow for a shorter time interval through the motor. This reduced current flow will reduce motor voltage and cause the motor to run more slowly, thereby adding to the speed fluctuations. Also, as a second example, a fluctuating increase in motor speed gives an increase in T1, shifting the "current curve" of FIG. 19A to the right, and T2 remains substantially constant. The current in the motor will then flow for a longer time interval and therefore will cause an increase in motor voltage, and the motor speed to increase, and so adds to the fluctuation. Thus, a substantially fixed firing delay leads to positive feedback which makes motor speed fluctuations grow and become worse. The motor speed fluctuations are not damped until the energy saving routine catches up with the changed conditions and appropriately modifies the "firing delay" T2.

Full Conduction Firing

Full conduction of the thyristors 120, 122, 124, 126, 128, 130 means that substationally full line voltage is applied to the motor. In full conduction, each thyristor conducts during substantially all of its appropriate half cycle. Full conduction is signaled by microcomputer 1 raising Signal 3 near, and finally, above the peak of the sawtooth signal at pin 3 of IC-11 FIG. 3, as shown generally in FIG. 14A, and as shown specifically in FIG. 14E. In FIG. 14E, Signal 3, at pin 2 of IC-11, exceeds the peak of the sawtooth wave applied to pin 3 of IC-11. Line 154, shown in FIG. 14A, then moves to the left of the current zero crossing at time 157.

When Signal 3 moves sufficiently high that time 154 reaches the current zero crossing time 157, then the following events happen:

(1) Full conduction is reached;

(2) Pin 1 of IC-11 and pin 2 of IC-5 stay at 0 volts, signalling a "rady to fire" condition, as shown in FIG. 14F.

(3) Pin 8 of IC-5 remains at 0 volts signalling that the controler is ON, as shown in FIG. 14G.

(4) Firing of the thyristors is controlled by the "shorted thyristor" detector signal at pin 1 of IC-5, as shown in FIG. 14H, and is no longer controlled by the "firing signal" on pin 2 of IC-5. The output of IC-5, at pin 9 of IC-5 is shown in FIG. 14J. Pin 1 of IC-5 goes LOW as the current reaches zero at time 157.

(5) The microcomputer then, during voltage ramp start and during energy saving under heavy load, will drive Signal 3 above the sawtooth as shown in FIG. 14E.

Referring to FIG. 17, during full conduction, gate drive is applied to the thyristor beginning after current crosses zero and remains on until the feedback signal from the "voltage level sensor" 223 turns the gate drive OFF. Logic circuit 221, shown in FIG. 17, represents integrated circuit IC-5 shown in FIG. 3. The "gate level signal" is at constant "enable" condition as shown in FIG. 14F with pin 2 of IC-5 at 0 volts. The "voltage level sensor" picks up the decrease in thyristor voltage as the thyristor begins to conduct and causes logic circuit 221 to turn OFF the gate drive current to the thyristor.

The "voltage level sensor" 223, as shown in FIG. 4, is supplied by bridge BR3 and opto-isolator IC-7 for line 1; bridge BR4 and opto-isolator IC-8 for line L2; and, bridge BR5 and opto-isolator IC-9 for line L3.

Figure 15F:
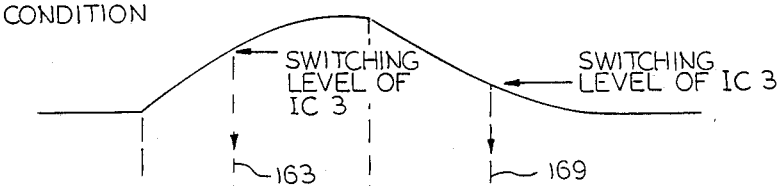
Figure 15G:
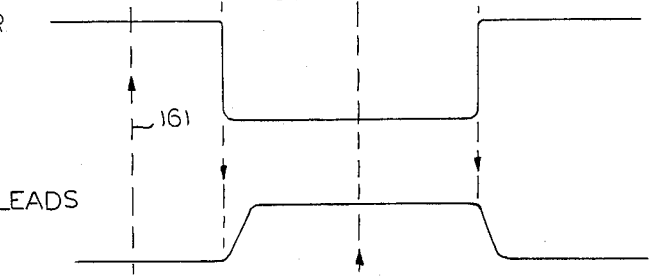
Figure 15H:
Figure 15J:
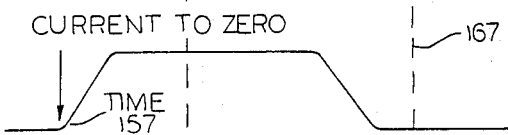
Figure 15K:
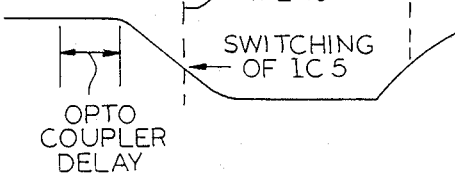

FIG. 15F through FIG. 15K show, on an expanded time scale, the sequence of voltage levels and switching events. Start the analysis at a point in the AC cycle when the load current through a conducting thyristor goes to zero, time 157 shown in FIG. 14C and in FIG. 19A. The thyristor voltage (L1 to T1 for line L1) begins to rise at the time that thyristor conduction ceases, time 157, as shown in FIG. 15J. The voltage sensor opto-isolator output voltage (that is also pin 1 of IC-5, the NOR gate input voltage) begins to fall after a short delay caused by the opto-isolator as is shown in FIG. 15K. The logic circuit IC-5 switches at time 161 as shown in FIG. 15K. The output of the logic circuit, pin 9 of IC-5 begins to rise at time 161, but does so slowly as capacitor C30 charges, as shown in FIG. 15F. Amplifier 225 of FIG. 17, IC-3 of FIG. 3, switches at time 163 and causes current flow to pulse transformer PT1, 162 of FIG. 4, as shown in FIG. 15G. Gate drive to the thyristor is generated as an output of transformer 162, as shown in FIG. 15H. The voltage, L1 to T1, across the thyristors, collapses, as shown in FIG. 15J. The opto-isolator senses the fall in thyristor voltage, as shown in FIG. 15K, causing pin 1 of IC5 to tend towards zero, a logic low, with the delay time dependent upon the opto-isolator. The logic circuit IC5 finally switches at time 167 as shown in FIG. 15K causing the logic output, pin 9 of IC5, to begin falling as shown in FIG. 15F. The output of the logic circuit, pin 9 of IC5, begins to decrease as capacitor C30 discharges, as shown in FIG. 15F. When the output of the logic circuit, pin 9 of IC5, reaches the switching voltage of the amplifier IC3 at time 169, then amplifier IC3 switches and cuts off current flow into the primary of transformer PT-1, as shown in FIG. 15G. Gate drive to the thyristor then ceases as shown in FIG. 15H.

The delay introduced by capacitor C30 and extending the time required for logic circuit IC5 at pin 9 to switch the amplifier IC-3, as shown in FIG. 15F, is long enough to allow the thyristor to latch ON before the gate drive is removed at time 169.

A problem arises if the feedback loop, through logic circuit 221, turns off the gate drive current too quickly. The circuit may be analyzed by starting at the point in the AC cycle where load current through a conducting thyristor reaches zero. The conducting thyristor turns OFF, voltage appears across the blocking thyristors, and the voltage is detected by the opto-isolator "voltage level sensor" 223. The output of the "voltage level sensor" 223 is a logic signal, sent to logic circuit 221, a NOR gate IC-5, and the output begins to fall. When it falls to the switching level of the logic circuit 221, NOR gate IC-5, the logic circuit 221 turns on an amplifier which supplies a gate signal to the thyristors through a pulse transformer such as transformer PT1, 162, as shown in FIG. 4, for line L1. A thyristor turns on, collapses the voltage (L1 to T1 for line L1) across the conducting thyristor, and the output of the "voltage level sensor" 223 begins to rise again. Because very little time has passed since the output of the opto-isolator fell below the switching level of the logic circuit 221, the output of the opto-isolator does not fall much further, and quickly rises again above the switching level of logic circuit 221. Logic circuit 221 therefore causes the gate signal to be removed from the thyristor before the thyristor has time to reach its latched condition, and consequently the thyristor turns OFF again. This cycle is repeated a number of time before the thyristor finally stays ON.

The introduction of the delay 222 at the output of the logic circuit 221 solves the problem. The delay is introduced by capacitor C30 at pin 9 of IC-5 for line 1. For line 2 C31 introduces the delay. For line 3 C32 introduces the delay.

With delay 222 in the feedback loop, the circuit events may be analyzed as before. Returning to the point in the AC cycle where the load current through a conducting thyristor reaches zero, the thyristors begin blocking, voltage appears across the thyristors, and the shorted thyristor detector, "voltage level sensor" 223 output begins to fall as shown in FIG. 15K. When the "voltage level sensor" 223 output falls to the switching level of the NOR gate, at time 161, no firing signal for the thyristor is generated; because the output of the logic circuit 221, NOR gate IC-5, is still rising as it charges the capacitor (C30 for line L1), as shown in FIG. 15F. During this charging time for capacitor C30, the output of the shorted thyristor detector "voltage level sensor" 223 continues to fall as shown in FIG. 15K. Finally, the voltage at the output of the logic circuit 221, NOR gate IC-5 pin 9, rises to the switching level of the amplifier 225 and the thyristor is gated ON at time 163.

When the thyristor is fired, there are two delays before the gate signal is removed. The first delay is in the "voltage level sensor" 223 opto-isolator detector (IC7 for line L1). Since the opto-isolator has fully or nearly reached the 0 level, there is a delay while the opto-isolator output rises toward the switching level of the logic circuit, NOR gate IC-5 reaching the switching level at time 167. When the opto-isolator reaches the switching level of the NOR gate, a second delay, caused by the discharge of C30 for line L1, begins as the output of the NOR gate falls to the switching level of the amplifier, which occurs at time 169. The two delays, added together, allow ample time for the thyristor to turn ON and latch, and turn the pulse transformer 162 (FIG. 4) OFF before it saturates.

A gating time of approximately 30 to 70 microseconds has been found convenient as sufficient for the length of the gating pulse to permit conduction of the thyristor to reach a stable value.

In an alternative embodiment, delay 222 may be inserted between voltage level sensor 223 and logic circuit 221, as shown by dotted line block 227.

Motor Not Running

During intervals in which the motor is not turned "ON", the program continues to execute on each AC line cycle. Upon reaching point 312 on a "present" line cycle, the "controller on" decision block 330 answers NO and the program branches to "end of line cycle" block 302. At end of line cycle block 302 the program waits until the end of the line cycle by executing branch 352. In executing branch 352, the program executes "check for shorted SCR and phase loss" block 354 before returning to "end of line cycle" block 302. "Check for shorted SCR and phase loss" block 354 checks for the absence of voltage across the pairs of thyristors in lines L1, L2, and L3. If voltage is absent from a pair of thyristors in any line for a period of time exceeding one (1) millisecond, this absence of voltage will be interpreted as a short, and a line cycle counter will be decremented. The line cycle counter is initially initialized at several line cycles. Therefore, after several consecutive detections of a short the counter will reach zero. Later block 314 will find the shorted condition by checking the counter and finding a zero, and will turn the controller OFF.

Hardware block 16 signals that a phase is missing by preventing the timing signal from line L1 from reaching the microcomputer. The absence of the timing signal for a time interval exceeding 1 1 line cycles causes block 354 to set a "phase loss" flag. Later clock 308 will test the "phase loss" flag and turn the controller OFF.

Control Power

Control power is maintained to power supply 17 when the motor is turned "off". Thus, the program circulates through "start button pressed" block 322 and branches to the "turn off controller" block 326 during every line cycle in which the control power is applied to power supply 17, but the motor is turned "off". When the motor is turned "off", the program branches in "controller on" decision block 330 to the "end of line cycle" block 302. While in the end of line cycle block 302, the program executes the "check for shorted SCR and phase loss" block 354 until the line cycle ends, and then executes "initialize timer" block 340 and then returns on line 304 to "overload routine" 306.

In the event that the controller is "on", the program branches at "controller on" decision block 330 and goes to "current crossed zero" block 342.

Overload Routine

The function of "overload routine" 306 is to substantially monitor the "temperature" of the motor and to turn off the motor if it becomes "too hot".

Figure 21:
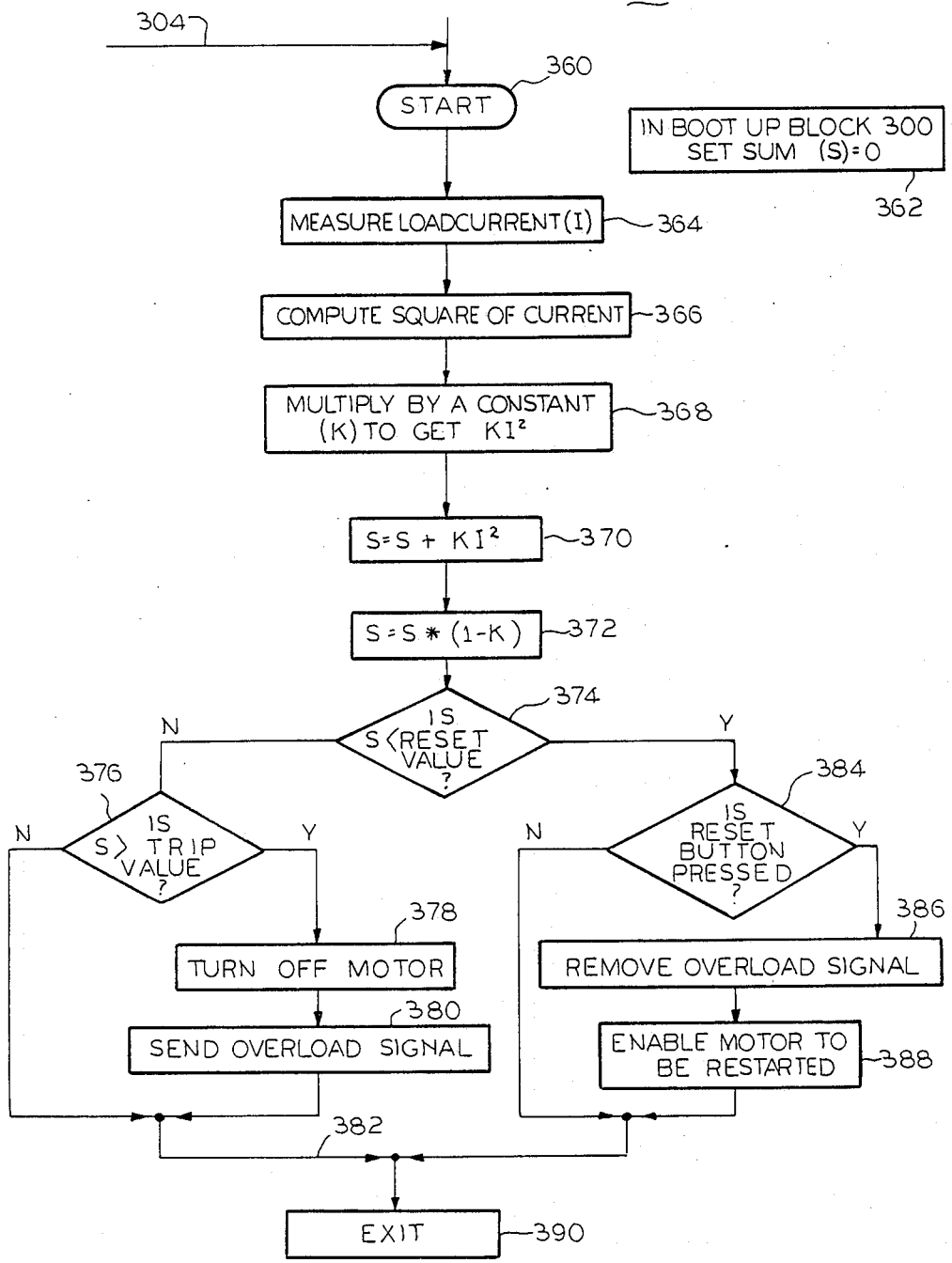
FIG. 21 is a flow diagram for an overload routine.

Details of overload routine 306 are shown in FIG. 21. The program enters the overload routine at start block 360. A running sum variable "sum (S)" was set equal to 0 in boot-up at block 300. The load current is measured at an analog voltage input to microcomputer 1 from "current peak detector and scaler" 9 at pins 23, PD1–AN1, and pin 24, PD0–AN0 of microcomputer 1, and this measurement occurs at block 364. The square of the current is computed at block 366. The square of the current is multiplied by constant K at block 368. Running sum "S" is increased at block 370 by adding to it the product of constant K and the square of the current.

Running sum "S" is reduced by multiplying it by (1-K) at block 372.

The value of sum "S" is tested at decision block 374, and if sum "S" exceeds a "reset vaue" the program branches to decision block 376. At decision block 376 the value of sum "S" is compared with a "trip value", and if the value of sum "S" exceeds the "trip vaue", then: the program branches to "turn off motor" block 378; turns off the motor; sends an overload signal to the other hardware at block 380; and finally returns to point 382. In the event that the value of sum "S" does not exceed the trip value, the program branches at decision block 376 directly to point 382.

At decision block 374, in the event that the value of sum "S" is less than the reset value, the program branches to decision block 384 where the microcomputer 1 determines if the reset button 606 (FIG. 2 and FIGS. 29–32) has been pressed by an operator. In the event that the reset button 606 has not been pressed, the program simply branches to point 382. In the event that the reset button 606 has been pressed, the program branches to "remove overload signal" block 386 and then goes to "enable motor to be restarted" block 388. The effect of the program executing block 386 and block 388 is to enable the motor to start on the next alternating current cycle. At point 382 the program goes to exit block 390.

On subsequent line cycles while the motor is running, the sum S will be increased by an amount proportional to the square of the current to the motor, and will be decreased by an amount given by (1-K). The sum then increases in proportion to the energy dissipation within the motor.

The flow of heat away from the motor is simulated by decreasing sum S through multiplying it by (1-K). Thus, the sum S has a value which is approximately proportional to the accumulated heat in the motor, as S increases with a "heat source" proportional to the current square, and decreases in proportion to a linear factor which simulates the flow of heat away from the motor.

The motor trip current is chosen to protect the motor in a particular application and may be chosen as a factor times motor full load current.

It is practice to choose a trip time T for a current of approximately 6 times the motor trip current. The time constant C is then given by the following expression:

$$C = (-T)/(Ln(1 - 1/36))$$
$$= 35.5 T$$

The vaue of K is then calculated by the following expression:

$$K = \frac{\text{Elapsed Time}}{\text{Time Constant}}$$
$$= \frac{1/60 \text{ sec}}{C} \quad \text{for 60 Hz}$$
$$= \frac{1/50 \text{ sec}}{C} \quad \text{for 50 Hz}$$

The above expression is useful for calculating time constant C when a trip time T is specified. The 36 in the denominator of the logarithmic term represents the square of 6 times trip current. It has been found convenient to choose a trip time T of 6 seconds. This gives the overload routine a class 10 trip characteristic, in that it will trip out after 6 times trip current is supplied to the motor for 6 seconds. Time constant C may be modified to provide class 20, class 30, or any other trip characteristics. For example, a class 30 trip characteristic means that the overload routine stops the motor within 30 seconds if the motor draws 6 times trip current.

Voltage Ramp Routine

Voltage ramp routine 348 provides a "soft start" of the motor by ramping up the voltage applied to the motor.

Figure 22:
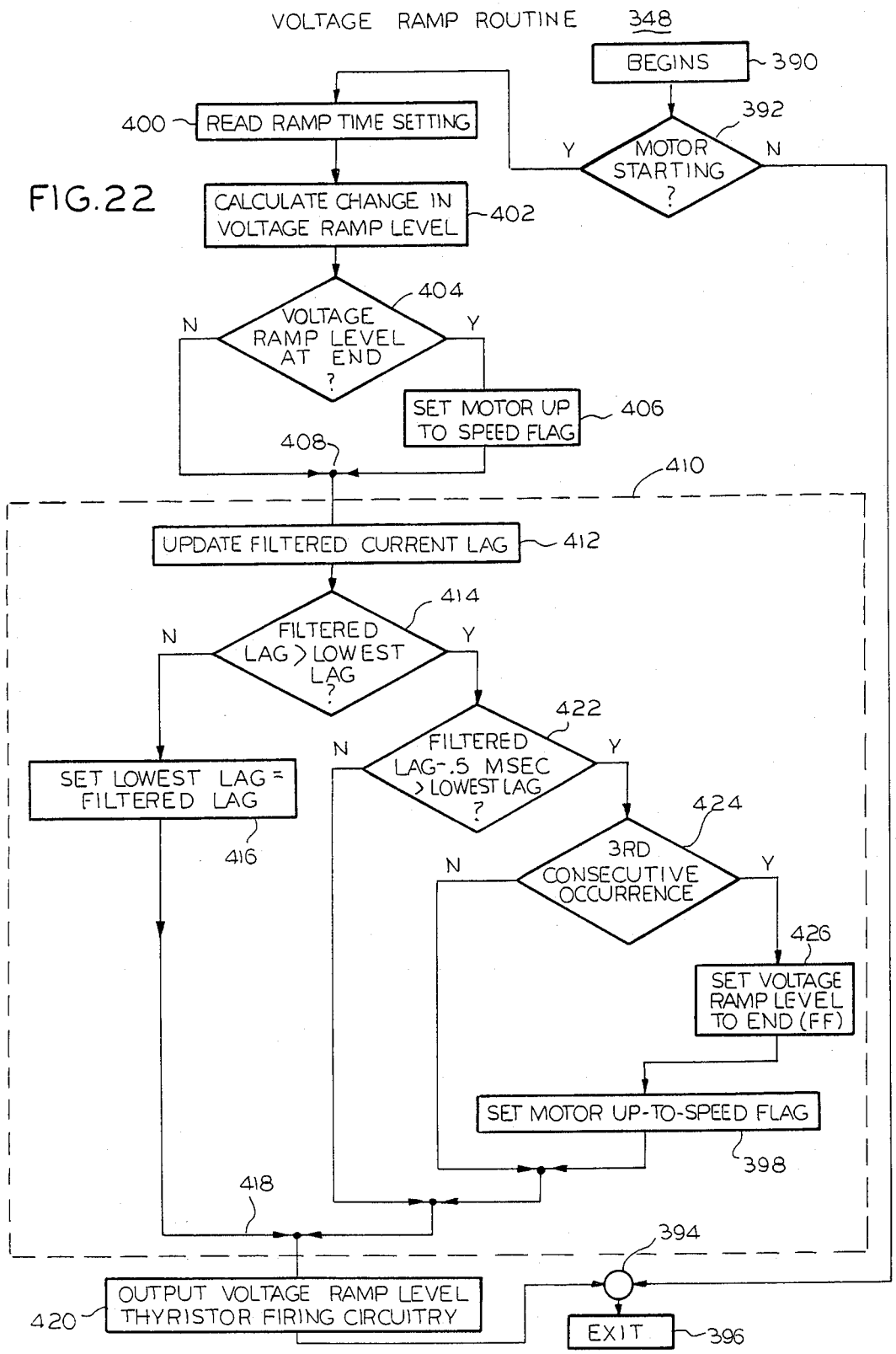
FIG. 22 is a flow diagram for a voltage ramp routine.

FIG. 22 is a flow diagram of "voltage ramp routine" 348. Voltage ramp routine 348 begins at "begin" block 390 each time the routine is called. The program then goes to "motor starting" decision block 392 where the "motor up to speed" flag is tested. In the event that the motor is not "starting" the program goes to point 394 where it exits the voltage ramp routine 348 at block 396. The "motor up to speed" flag is set at block 398, or at block 406, to indicate that the motor is running at full speed, as will be discussed hereinbelow in greater detail.

In the event that motor starting decision block 392 determines that the motor is starting, the program goes to "read ramp time setting" block 400 where it reads the setting of potentiometer RH2 as shown in FIG. 2. At block 402 the program calculates the new level for the ramp voltage. At decision block 404 the program determines if the ramp level is at full line voltage. If the ramp has reached full line voltge the program goes to block 406 where the "motor up to speed" flag is set to indicate that the motor is at full speed. This flag will then be tested at decision block 392 on the next AC cycle when voltage ramp routine 348 is again called. The program then proceeds to block 408. In the event that decision block 404 determines that the voltage ramp level is not at line voltage, the program proceeds to point 408.

Dotted line 410 encloses program elements which accomplish a "fast turn on routine". The purpose of the "fast turn on" routine is to prevent the motor from oscillating in the event it reaches full speed before the applied voltage reaches full line voltage.

From point 408 the program executes block 412 and updates a "filtered current lag" value. The "filtered current lag" is computed as a moving average utilizing previous measured values of the current lag and also a present measured value of the current lag. The current lag is determined by program block 346 in FIG. 18B where the timer measuring the interval between voltage 0 crossing time, obtained at block 340 and the current 0 crossing (or reaching) time, determined at block 342, is interrogated. The time interval read from the timer at block 346 is proportional to current lag. The "filtered current lag" is computed as three parts of the present average value of the "filtered current lag" plus one part of the latest measured value.

The filtered current lag determined at block 412 is then utlized in a series of decision blocks to determine whether or not the motor has reached full speed before the applied voltage reaches line voltage.

Figure 25:
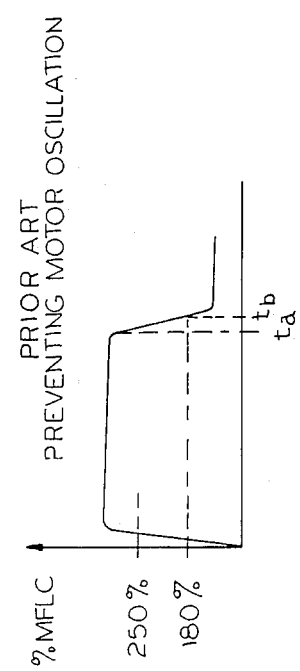
FIG. 25 is a graph showing motor voltage vs time and motor current vs. time, and illustrating current "lag".

FIG. 25 is a general diagram showing current lag. A timer is initialized when the voltage crosses 0 as determined by the program at blocks 301, 302, 301A, or 332A. The timer is read by blocks 346 or 346A after the current crosses 0 or reaches 0. The time reported by the timer is then proportional to the current lag as shown in FIG. 25.

Figure 26:
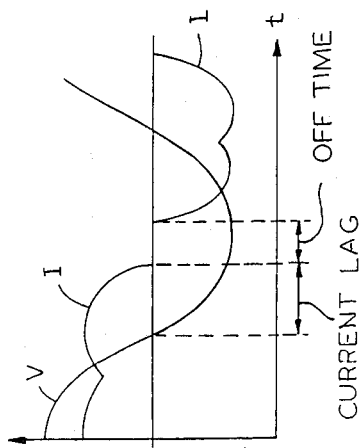
FIG. 26 is a graph of current "lag" vs time showing detection of motor "up-to-speed" conditions using the present invention.

FIG. 26 shows the variation in current lag as a function of time as the motor turns on and subsequently reaches full speed. Current lag is measured in units of time, which is equivalent to electrical degrees. When the motor is first turned on, the current lag is relatively large, the initial values of current lag will be in the $TI_1$ to $TI_2$ time range. As the motor picks up speed the current lag slowly decreases until time $T_a$, when the motor is operating at full speed. The subsequent behavior of the current lag is determined by the loading of the motor. Under a light load the current lag will increase quite rapidly to a larger value. Under a medium load, the current lag will increase, but not as much as under a light load, but still very rapidly. Under a heavy load, the current lag will remain at the low value that it reached when the motor reached full speed at time $T_a$. The present invention detects the condition that the motor is at full speed by detecting the rapid increase in current "lag" shown in FIG. 26.

Thus, the fact that the motor is running at full speed is detected at time $T_b$ which occurs very quickly after the motor actually reaches full speed at time $T_a$.

The steps by which the computer program detects the event of the motor reaching full speed is shown in FIG. 22 at the decision blocks following "update filtered current lag" block 412. The "lowest lag" and average lag, or "filtered lag", are initialized to a value of hex FF at block 311, FIG. 18A, when the stop, overload, shorted SCR or phase loss commands are given. At decision block 414, the "filtered lag" is compared with the "lowest lag", and if the "filtered lag" is less than the "lowest lag" then the program goes to block 416 where the "lowest lag" is changed by being set equal to the "filtered lag". The program thereupon goes to point 418 from which it enters the "output voltage ramp level to thyristor firing circuitry" block 420 in which the level of signal 3, at terminal 150 of FIG. 2, is set appropriately. The program then goes to point 394 and exits the voltage ramp routine at block 396.

In the event that decision block 414 determines that the "filtered lag" is greater than the "lowest lag", then the program has perhaps detected the rise in lag shown at time $T_b$ in FIG. 26. In order to both filter noise from this signal and discriminate against an initial increase in lag that sometimes occurs at the beginning of a start as shown in FIG. 26, at $TI_1$ and $TI_2$, the program goes to decision block 422 where it is determined whether the filtered lag exceeds the lowest lag by more than 0.5 milliseconds. In the event that decision block 422 determines that NO is the answer, the program goes to point 418 and block 420, and then exits "voltage ramp routine" 348. In the event that decision block 422 determines that the filtered lag does exceed the "lowest lag" by greater than 0.5 milliseconds, the program goes to decision block 424. At decision block 424 the program determines if YES is the answer at decision block 422 for three consecutive line cycles. If YES is not the answer for three consecutive line cycles, the program goes to point 418, outputs the ramp level to the thyristors at block 420, and exits the routine.

In the event that the filtered lag exceeds the lowest lag by more than 0.5 milliseconds for three consecutive line cycles, then the program exits decision block 424 and proceeds to block 426. At block 426 the voltage applied to the motor is immediately changed to line voltage. This is done by setting the ramp level to FF which is the largest value available to microcomputer 1. Once the voltage applied to the motor is set to full line voltage, the program goes to block 398 where it sets the "motor up to speed flag" in order to signal other segments of the program that the motor is running at full speed. The program then goes to point 418 and then to block 420 where the voltage of signal 3 is set to fire the thyristors so as to apply full line voltage to the motor. The voltage ramp routine then exits at block 396.

A heavily loaded motor reaches full speed under the influence of the ramp, without the lag going through a minimum. The lag of a heavily loaded motor becomes substantially constant after the motor reaches full speed. This constancy of the lag may be used to detect an up-to-speed condition of a heavily loaded motor.

Figure 23:
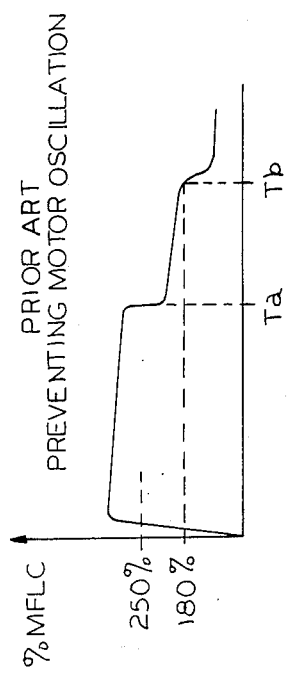
FIG. 23 is a graph showing motor current vs time in a prior art technique for sensing motor "up-to-speed" by measuring motor current.
Figure 24:
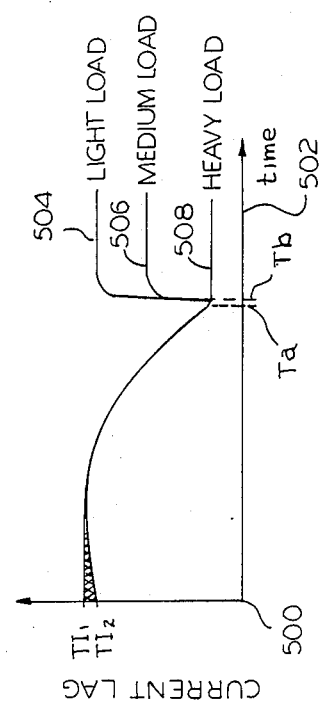
FIG. 24 is a graph of motor current vs time showing a failure in the prior art shown in FIG. 23.

A voltage ramp fast turn on apparatus has been described in Kampf, et al., U.S. Pat. No. 4,634,951, filed as U.S. patent application Ser. No. 743,862 on June 3, 1985, case IC-653. The apparatus described by Kampf, et al. utilizes passage of motor current upwardly through a current level and subsequent passage downwardly through the same current level. The method disclosed by Kampf, et al works quite well in many cases, but fails to work in those situations in which the motor current does not fall rapidly through the same current level. It has been found that in practice motor current will occasionally not fall through the second current level within the necessarily short time required by the apparatus of the disclosure of Kampf, et al. FIG. 23 shows a graph of percent maximum full load current to the motor (% MFLC) versus time. In the apparatus of Kampf, et al. the event that the motor is running at full speed is signaled by the passage of the motor current upwardly through the 180% level, and subsequently downwardly through the 180% level. The time indicated by $T_a$ is the time that the motor reaches full speed. The time indicated by $T_b$ is the time at which the apparatus detects that the motor has reached full speed. The motor has a possibility of oscillating in the time interval between $T_a$ and $T_b$. The "fast turn on routine" is designed to drive the motor voltage to full line voltage as soon as possible after the motor reaches full speed. FIG. 24 shows the situation in which motor current detection does not provide a sufficient indication that the motor is at full speed. In FIG. 24, the motor reaches full speed at $T_a$ but the current decreases slowly over a long time interval until it drops below 180% of MFLC at $T_b$. The motor may oscillate during the extended time interval between $T_a$ and $T_b$ if the ramp has not driven the motor voltage to full line voltage during the time interval between $T_a$ and $T_b$. The present invention detects current lag in order to determine if the motor is running at full speed, and thereby solves the above-described problem left unsolved by the Kampf, et al. disclosure.

Energy Saving Routine

Figure 28:
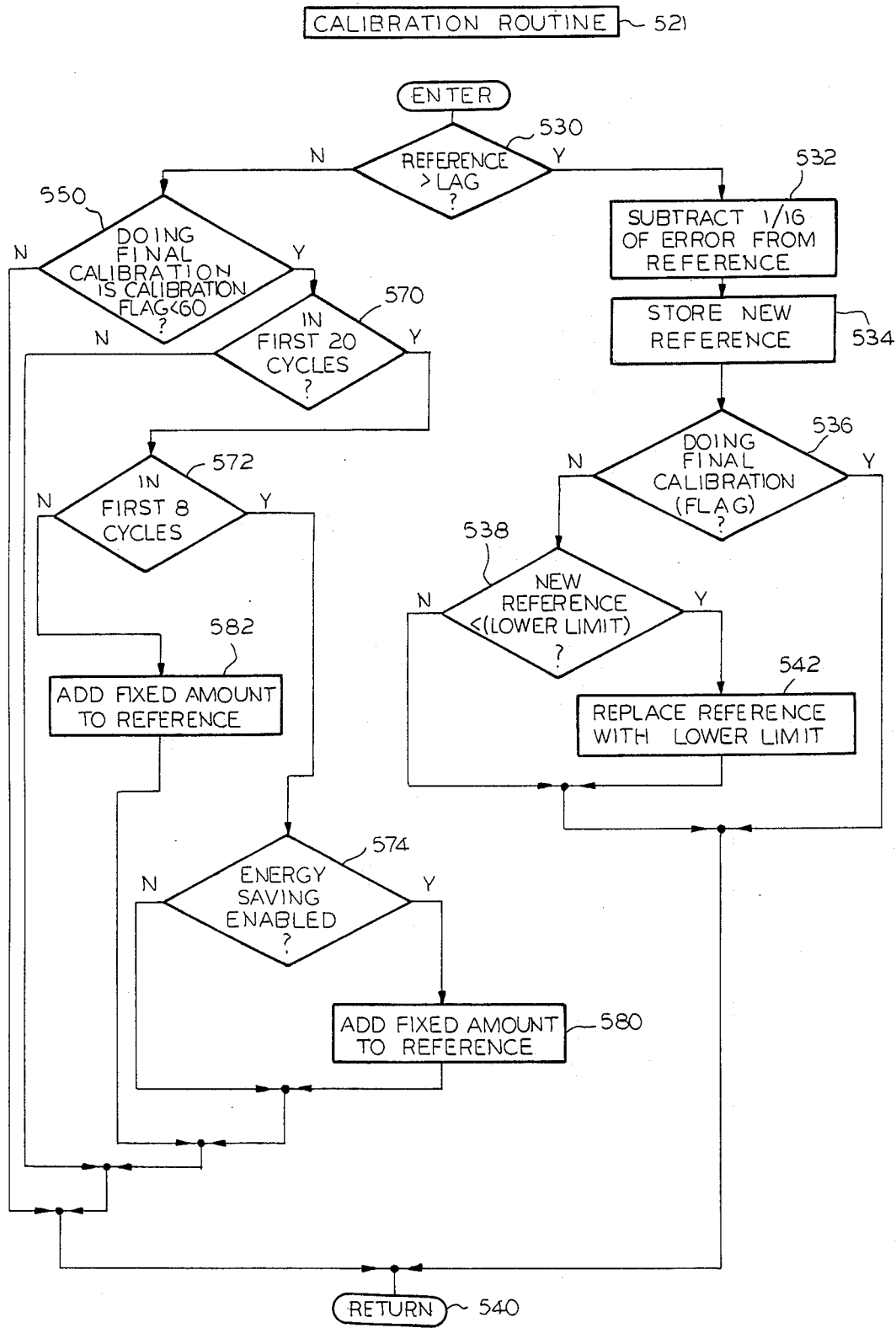
FIG. 28 is a flow diagram for a calibration routine.
Figure 29:
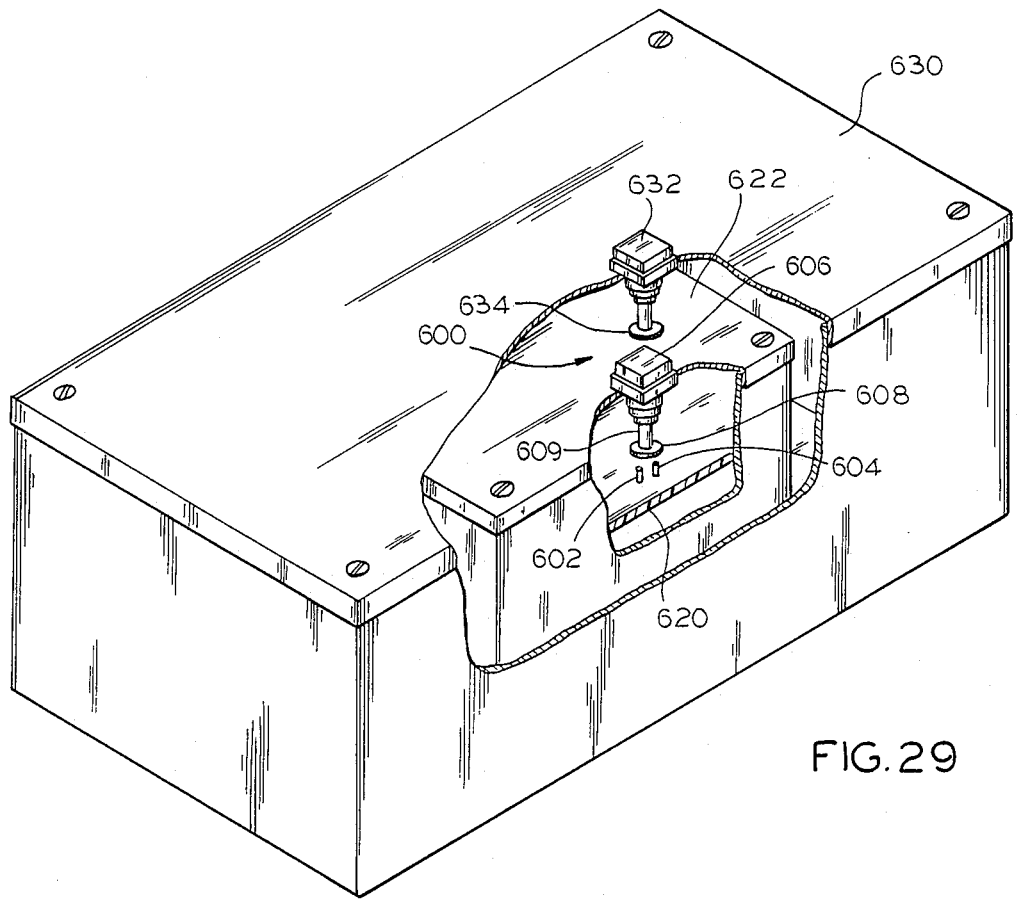
FIG. 29 is a partial cutaway isometric view of an enclosure, a housing, and a reset mechanism.
Figure 30:
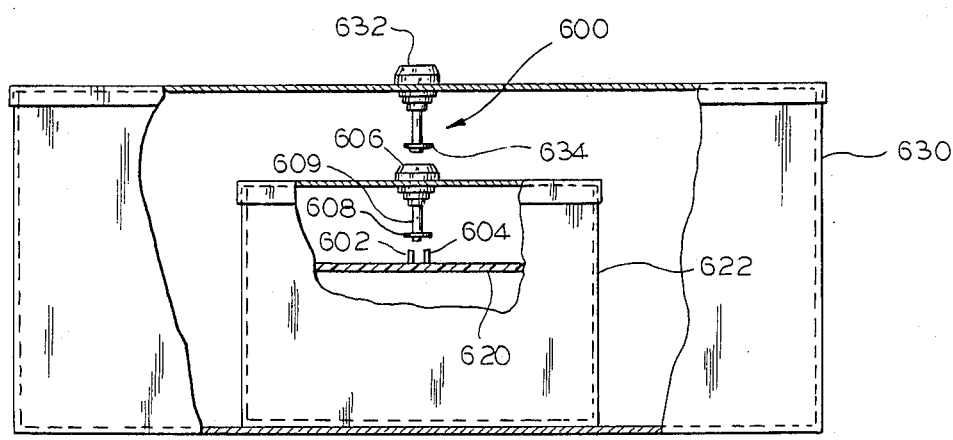
FIG. 30 is a sectional view of a housing, an enclosure, and a reset mechanism.

Details of energy saving routine 350 are shown in FIGS. 27, and 28. The purpose of the energy saving routine is to monitor the phase angle at which the motor is operating and to reduce motor voltage so as to increase the power factor in the event that the motor is lightly loaded. A lightly loaded motor operating at full line voltage draws a low current and also operates with a large current lag. Also the power factor, which is the cosine of the current lag expressed in electrical degrees, is small for a lightly loaded motor. The "energy saving routine" 350 reduces the voltage applied to the motor in order to increase the power factor.

The operation of energy saving routine 350, as shown in FIGS. 27, 28, may conveniently be understood by tracing the program flow as a motor starts. The time behavior of the current lag as a motor starts is shown in FIG. 26. Current lag, for the purpose of this discussion, will be measured in units of time. When the motor first starts, the current lag is approximately between time $TI_1$ and $TI_2$ as shown in FIG. 26 at the 0 point 500 of the time axis 502. As shown in FIG. 26, as the motor speeds up, that is as time progresses along time axis 502, the current lag decreases until time $T_a$. At time $T_a$ the motor reaches full speed. For a motor that is lightly loaded the current lag rapidly rises to a value shown by curve 504. If the motor is driving a medium load, the current lag will rise, as shown in curve 506, but not as high as it rises for a lightly loaded motor. For a heavily loaded motor as shown in curve 508, the current lag will remain at the low value reached as the motor reaches full speed.

When the power supply 17 of motor controller 100 is first energized, a number of parameters used in the energy saving routine are initialized. These parameters include the "reference" current lag which is initialized to the largest byte value FF. An "up to speed" flag is initialized to indicate that the motor is not up to speed, and this flag is reset by the voltage ramp routine 348 when the motor reaches full speed. Also, a "calibration count" value is initialized to 60. A "calibration finished" flag is initialized to indicate the calibration is not finished.

After the START button is pressed, the computer program, as shown in FIGS. 18A, 18B passes through a number of decision blocks and finally reaches energy saving routine 350. The current lag is compared at block 504 of FIG. 27 with the "reference" current lag in order to measure an "error". The "motor starting" block 506 then tests the "up to speed" flag to determine if the motor is operating at full speed. Since operation of the program is being traced immediately after the START button was pushed, the program is in the first line cycle, and so the "up to speed" flag will indicate that the motor is not at full speed and decision block 506 will exit at the YES branch to decision block 508. The routine is in the first line cycle so the decision block "in first 5 cycles" 508 will answer YES and the program will proceed to "3rd cycle of first start" decision block 510. Decision block 510 will answer YES only if the program is in the third line cycle following actuation of the START button on the first start after boot up. Thus, decision block 510 will answer NO and the program will branch to point 512. From point 512, the program proceeds to exit block 514.

On the second line cycle, the program will enter "energy saving routine" 350, compute the error at block 504 and again branch to "third cycle of first start" decision block 510 where the test will yield a NO, and the program will proceed to exit block 514. On the third line cycle, the program will enter the "energy saving routine" block 350, proceed to "third cycle of first start" decision block 510, and block 510 will answer YES sending the program to block 516. At block 516 the "reference" will be set equal to the "current lag" measured on the 3rd line cycle. The program then will proceed to exit block 514. On the fourth and fifth cycles decision block 508 will answer YES, decision block 510 will answer NO, and the program will proceed to exit block 514.

On the sixth line cycle, and on all subsequent line cycles, decision block 508 will answer NO and the program will proceed to decision block 518. At decision block 518 the "calibration finished" flag is tested, this flag will test NO on the sixth line cycle, and the program will proceed to block 520. At block 520 a call to "calibrate routine" 521 will be executed.

Details of the "calibrate routine" 521 are shown in FIG. 28. The program will enter "reference greater than lag" decision block 530. Referring to FIG. 26, it is seen that it is expected that the current lag will decrease as the motor proceeds to start. Thus, the current lag measured in this, the 6th, line cycle will be less than the reference value, which was set equal to the lag during the 3rd cycle at block 516. Thus, decision block 530 will answer YES and the program will proceed to block 532. At block 532, 1/16 of the "error", which is the difference between the reference value and the measured current lag as determined at block 504, will be subtracted from the reference. The new value of the reference will be stored at block 534. At decision block 536 the "final calibration" flag will be tested, the result will be NO, and the program will proceed to decision block 538. At decision block 538 the new "reference" value will be tested against an imposed lower limit. If the new value of the reference is not less than the lower limit, decision block 538 will answer NO and the program will proceed to "return" block 540. In the event that the reference is less than the "lower limit", decision block 538 will answer YES, and the reference will be replaced by the lower limit at block 542. The program will then proceed to exit block 540. It has been found convenient, for a variety of types of motors, to prevent the reference from becoming less than approximately 1,216 milliseconds, or, the equivalent value of 26.3 electrical degrees for 60 Hz.

On subsequent line cycles, the program will enter "energy saving" routine 350, compute the error at block 504, and test the "up to speed" flag at decision block 506. As the motor gains speed between the origin 500 and time $T_a$, as shown on time axis 502 in FIG. 26, decision block 506 will answer YES, the program will proceed to decision block 508, which will answer NO, and the program will proceed to decision block 518 which will also answer NO, and the program will then proceed to "call calibrate routine" 520. "Calibrate routine" 521 will be called at block 520 for each succeeding line cycle until the motor reaches time $T_b$, at which time the "up to speed" flag will be set by "voltage ramp" routine 348 to indicate that the motor is up to full speed. Each time the program passes through "call calibrate routine" block 520 the program will enter calibration routine 521. In "calibration routine" 521 the program tests the "reference" against the measured lag for that line cycle at decision block 530, and if the motor performs as shown in FIG. 26, will find the measured lag less than the reference lag and so will answer YES, and the program will proceed to block 532. At block 532 the reference will be reduced by 1/16 of the "error", and if the reference does not become less than the "lower limit" the program will exit at block 540 with the smaller value of the reference stored in memory.

When the motor reaches full speed at time $T_a$ in FIG. 26, the current lag will increase if the motor is either lightly loaded, curve 504, or has a medium load, curve 506. The "up to speed" flag will be set to indicate that the motor is at full speed, and on the next line cycle decision block 506 will answer NO and the program will proceed to decision block 524. On the first line cycle after the "up to speed" flag is "set", the motor current will probably exceed 100% motor full load current, as shown in either FIG. 23 or 24, and so the decision block 524 will answer YES, and the motor will proceed to block 526. At block 526 full voltage will be applied to the motor by the microprocessor acting through "digital/analog firing delay converter" 2. A flag called "disable energy saving" will be set at block 528. The "final calibration count" will be reinitialized to 60 at block 530. The program will then proceed to exit block 514.

In the event that the motor current remains above 100% motor full load current on subsequent line cycles, the program will continue to pass through blocks 526, 528, and 530, resulting in the energy saving routine 350 calling for application of full line voltage to the motor.

In the event that the motor current drops below 100% motor full load current on a subsequent line cycle, as will happen if the motor is lightly loaded, decision block 524 will answer NO and the program will proceed to decision block 540. At decision block 540, the motor current will be interrogated, and if it is less than 85% motor full load current, then decision block 540 will answer YES and the program will proceed to block 542. At block 542, the "enable energy saving" flag will be set to ENABLE. The program then proceeds to decision block 544 and interrogates the "calibration finished" flag. On the first passage through decision block 544, block 544 will answer NO and the program will proceed to block 546. At block 546 the "final calibration count" will be reset to equal 60. At block 548 the "calibration routine" 521 will be called. Calibration routine 521 will test the reference against the lag at decision block 530. At this point in time, the lag may be either less than the reference or greater than the reference. In the event that the lag is less than the reference, decision block 530 answers YES and the reference will be reduced in block 532 and the program will proceed to exit block 540. In the event that the lag is greater than the reference, block 530 will answer NO, decision block 550 will query the "doing final calibration" flag, will answer NO; and the program will again proceed to exit block 540.

The "doing final calibration" flag will be set to indicate TRUE only if the program manages to reach decrement block 556 as shown in FIG. 27. In the event that the program reaches decision block 540 and the current exceeds 85 percent of motor full load current, then the program proceeds to decision block 552. In order to reach decision block 552, the motor current must be less than 100% and greater than 85% of motor full load current as determined by decision block 524 and decision block 540. At decision block 552, the "calibration finished" flag is queried, the answer will be NO, and the program will proceed to block 554 where a call to "calibration routine" 521 is executed. "Calibration routine" 521 will test the reference against the measured lag at decision block 530. If the reference exceeds the lag, then the reference will be reduced at block 532. If the reference is less than the lag, decision block 530 will answer NO and the program proceeds to decision block 550. The "final calibration" flag is not yet set, and so decision block 550 proceeds to exit block 540.

Following block 554, the program proceeds to block 556 in which the "final calibration" count is decremented by one count. Decision block 558 queries the "final calibration" count, and if it is 0 answers YES, proceeds to block 560 at which the "calibration finished" flag is set TRUE. In the event that the calibration count is not equal to 0, and on the first trip through decision block 558 the "calibration count" will equal 59, decision block 558 answers NO, and the program proceeds to point 562.

Point 562 is reached from either block 544, 552, 548, 558 or 560. In any event, the "energy saving enabled" flag is queried, and if energy saving is enabled, the conduction of the thyristors is adjusted by block 564. Block 564 calculates the desired "OFF TIME", see description above in the section "current control firing". The conduction of the thyristors is adjusted by microcomputer 1 using current control firing, and controlling signal 3 through the "digital/analog firing delay converter" 2. In the event that energy saving is not enabled at decision block 563 the microcomputer 1 applies full voltage to the motor by adjusting thyristor conduction at block 566.

also at block 564 the OFF TIME is kept smaller than a predetermined maximum amount. It has been found convenient, for a variety of 3 phase motors, to prevent the OFF TIME from exceeding 50 degrees or 55 degrees. A longer OFF TIME has been found to lead to motor instabilities, and the motor instabilities are evidenced by fluctuations in motor speed and by fluctuations in motor current.

The program may pass through the branch comprising decision block 552, block 554, 556, and decision block 558 60 consecutive times. The "calibration count" is initialized at 60, and it is decremented by 1 at block 556. After it becomes 0, decision block 558 answers YES, the program proceeds to block 560 at which the "calibration finished" flag is set TRUE. On the next and subsequent line cycles, that flag is tested at decision block 552. In the event that it is set TRUE then decision block 552 answers YES and the program proceeds to point 562.

Block 554 calls "calibration routine" 521. In the event that the "reference" is less than the lag, decision block 530 answers NO and the program proceeds to decision block 550. Decision block 550 queries the "calibration count". The "calibration count" is initialized to 60, and is decremented by block 556. In the event that "calibration count" is less than 60, decision block 550 answers YES and the program proceeds to decision block 570. In the event that the decision block 570 is entered during the first 20 cycles after the calibration count is decremented by block 556, decision block 570 answers YES. The reference may be increased if the decision block 570 answers YES. Thus, the reference may be increased a maximum of 20 times as a result of decision block 570. On the 21st cycle and on subsequent cycles, decision block 570 answers NO and the program proceeds to exit block 540.

In the event that decision block 570 answers YES, the program proceeds to decision block 572 which answers YES if the program is in the first 8 cycles after the "calibration count" is first decremented by block 556. If decision block 572 answers YES, the program proceeds to decision block 574 at which it is determined which direction the motor current entered the 100%-85% motor full load current-window established by decision blocks 524 and 540. Decision block 574 queries the "energy saving" flag to determine if it is enabled. In the event that motor current has entered the 100%-85% window from above the window on motor start-up by decreasing from above 100% to below 100%, the "energy saving" flag was disabled at block 528 (FIG. 27) and the decision block 574 (FIG. 28) will answer NO, and the program proceeds to exit block 540. In the event that motor current increases from below 85% into the 85%-100% window, the "energy saving" flag was enabled by block 542 (FIG. 27), and decision block 574 will answer YES, the program proceeds to block 580 where a fixed amount is added to the reference. Decision block 574, which queries the "energy saving" flag, determines whether the motor is just starting or coming out of an overload when it reaches decision block 574. In the event that the motor is just starting or coming out of an overload, the reference is not increased. In the event that the motor current has risen to an excess of 85% motor full load current, but has not exceeded 100% motor full current, then a fixed amount is added to the reference at block 580.

In the event that decision block 572 determines that the motor is not in the first 8 line cycles after the "calibration count" is decremented below 60, then the fixed amount is added to the reference at block 582. In order to guard against a premature increase in the "reference" value, it has been found convenient in practice to have decision block 572 direct the program to decision block 574 in the event that the block 572 is reached within the first 8 line cycles after an initial decrement of the "calibration count".

It has been found convenient to use 128 microseconds, which is 2.76 electrical degrees at 60 Hz., as the fixed amount to add to the reference by blocks 580 and 582.

The final calibration branch comprising blocks 552, 554, 556, 558 and 560 working in conjunction with blocks 580 and 582 in the calibration routine 521, increase the reference in the event that it has been decreased to too small a value by passage through block 532 of calibration routine 521 during calibration outside of the 85%–100% window. As FIG. 26 shows, the current lag may start at values between $TI_1$ and $TI_2$, may decrease until the motor is at full speed at point $T_a$ on the time axis, and then will very likely increase. The branch of calibration routine 521 represented by decision blocks 570, 572, and blocks 580 and 582 permit the reference to be increased in the event that the decrease in the measured values causes an "over shoot" of the reference value.

During routine operation of the motor, each line cycle causes the program to execute decision block 563, FIG. 27. If the "energy saving" flag is enabled, then block 564 adjusts the firing conduction angle of thyristors 120, 122, 124, 126, 128, 130 by action of microcomputer 1 adjusting signal 3 by the "digital/analog firing delay converter" 2. The microcomputer 1 then controls thyristor connection using current control firing as previously discussed. If the measured current lag is greater than the reference lag, the firing delay angle for the thyristors is increased, thereby decreasing the voltage applied to the motor, in order to adjust the measured current lag to equal the "reference" lag as determined by the calibration routine. The "reference" current lag is the optimum value for operation of a lightly loaded motor. The optimum current lag will be approximately the minimum current lag measured in the vicinity of time $T_a$, when the motor achieves full speed.

The above method of setting the "reference value" of the lag guards against reducing the value to "too small" a value. An alternative approach is shown in Fitzpatrick, et al., U.S. Pat. No. 4,581,568, issued Apr. 8, 1986, wherein it is taught to set the "reference value" of the lag by taking the minimum value of the lag measured during motor starting and add to it a predetermined amount such as 4° to 12° of the electrical cycle. In contrast, the present invention uses a value of lag determined during motor starting as an "initial guess", and then does a final calibration if the motor is loaded and the current passes into a window of 100% to 85% of motor full load current.

There is a limit to how much the voltage to a very lightly loaded motor can be reduced. It has been found that the thyristor switches cannot be turned off for a time period exceeding approximately 55 electrical degrees for a very lightly loaded motor. Referring to FIG. 25, this limitation means that the interval where the current is zero cannot exceed approximately 55 electrical degrees. As a result, an unloaded motor cannot be maintained at a full load power factor.

Increases in the reference value are permitted by decision block 570 for 20 cycles. Sixty cycles of passage through block 544 are permitted by the decrement of the "calibration count", and all 60 cycles are permitted for the block 532 to decrease the reference. Thus, during the first 20 cycles blocks 580 and 582 may increase the reference, but there still remains 40 cycles during which block 532 may decrease the value of the reference, in case too much was added to it. Once the "calibration finished" flag is set at block 560, after the "calibration count" has been decremented 60 consecutive times, the final reference value is stored in the microcomputer 1 memory. Stopping the motor by pressing the STOP button does not disturb the stored value of the reference. On subsequent starts of the motor, the stored reference will be utilized for controlling thyristor firing conduction angles. The reference may be disturbed only by disconnecting 120 volt AC control power to power supply 17.

Block 564 saves energy by reducing the voltage applied to the motor so that the current lag achieves a desired value. The desired value is determined by energy saving routine 350 operating in conjunction with calibration routine 521. Reducing the current lag increases the power factor. By reducing the voltage applied to the motor, the current to the motor is reduced and power losses associated with the current flow are thereby reduced.

Reactive power, which is given by the product of the three quantities, current, voltage, and sine of the current lag, is greatly reduced by "energy saving" routine 350. In a power line metering system which charges for vars, the charges will be reduced by "energy saving" routine 350.

Reset Mechanism

Reset mechanism 600 permits reset of the motor controller after an overload trip. FIG. 2 shows a schematic diagram of reset mechanism 600. FIGS. 29–32 show the mechanical arrangement of reset mechanism 600. Pin 602 is connected to pin 13 of microcomputer 1. Pin 604 is connected to the +5 volts DC supply. Reset button 606 has conductor 608 mechanically connected thereto. Shaft 609 is made of insulating material and attaches reset button 606 to conductor 608. When reset button 606 is depressed, then conductor 608 is moved into simultaneous electrical contact with pin 602 and pin 604, thereby applying +5 volts DC to pin 13 of microcomputer 1. Microcomputer 1 senses the presence of the +5 volts DC signal on pin 13 when executing block 384 shown in FIG. 21. When the +5 volt DC is present on pin 13 of microcomputer 1 after an overload trip, then decision block 384 answers YES and enables motor starting at blocks 386 and 388. The motor can then be started on the next line cycle by decision block 318, FIG. 18A, answering NO, and the program then branching to decision block 322.

Referring to FIGS. 29–32, pins 602 and 604 are mounted on circuit board 620. Also microcomputer 1 is mounted on circuit board 620. Circuit board 620 is mounted inside of housing 622. Reset button 606 is mounted on housing 622. Housing 622 provides mechanical protection of circuit board 620, the electrical components (not shown) mounted on circuit board 620, and also provides mechanical support for electrical components (not shown) mounted directly to the interior of housing 622. Conductor 608 is shown in position 608A where it establishes an electrical connection between pin 602 and pin 604. Arrow 603 shows the direction of motion of condutor 608 when reset button 606 is depressed.

When reset button 606 is depressed by an operator, electrical contact is established between pin 602 and pin 604 by conductor 608. A minimum of electrical noise is introduced into the circuits by the arrangement of pins 602, 604 and conductor 608. An advantage of the arrangement is that one of the electrical leads leave circuit board 620. By permitting all electrical leads to remain permanently fixed to the circuit board, reset mechanism 600 contributes advantageously to reduction of electrical noise in the circuits.

Enclosure 630 may protect the circuit components from the environment, and may protect the environment from the circuit components. Button 632 provides operation of reset button 606 from outside of enclosure 630. When button 632 is depressed, then plunger 634 depresses reset button 606 which in turn causes conductor 608 to establish an electrical connection between pin 602 and pin 604, thereby resetting the motor controller.

Plunger 634 may be made out of a nonconducting material such as plastic. Housing 622 may be made of a light gauge metal and may have ventilation holes in order to promote cooling of the electrical components mounted inside of housing 622. Enclosure 630 may be made out of sheet steel.

It is to be understood that the above-described embodiments are simply illustrative of the principles of the invention. Various other modifications and changes may be made by those skilled in the art which will embody the principles of the invention and fall within the spirit and scope thereof.

The following related applications for U.S. Patent were filed on even date with the within application, and all disclosures in the related applications are incorporated herein by reference:

Case IC-661, Self Calibration of the Thyristor Firing Angle of a Motor Controller Using a Current Window to Determine a Final Value of a Reference Current Lag Phase Angle, inventors James T. Libert and Earl J. Curran, Ser. No. 06/919915, issued as U.S. Pat. No. 4,710,692;

Case IC-662, Overload Protection Apparatus for Emulating the Response of a Thermal Overload, inventor James T. Libert, Ser. No. 06/919917, issued as U.S. Pat. No. 4,796,142;

Case IC-663, Up to Speed Detector for an Electric Motor Using Measured Values of the Current Lag; and Voltage Ramp Controller Using the Up to Speed Indication, inventor Earl J. Curran, Ser. No. 06/920,099;

Case IC-666, Apparatus for Controlling Firing of Thyristors Relative to a Current Reaching Zero by Using a Microcomputer and Hardware Responsive to Voltage Crossing Zero, inventors Earl J. Curran and James T. Libert, Ser. No. 06/919916.

What is claimed is:

1. A gate drive circuit for a thyristor comprising:
means for supplying current to a gate electrode of said thyristor;
means for generating a timing signal to initiate conduction of said thyristor;
means, responsive to a voltage from cathode to anode of said thyristor, for generating a "voltage level" signal when said voltage from cathode to anode of said thyristor is reduced by conduction of said thyristor; and,
means, responsive to said "means for generating a timing signal" and said "means for generating a voltage level signal", for commanding said "means for supplying current to a gate electrode" to supply current to said gate electrode of said thyristor and for commanding said "means for supplying current to a gate electrode" to cease supplying current to said gate electrode of said thyristor at a predetermined time interval following generation of a voltage level signal by said "means for generating a voltage level signal", said predetermined time interval being chosen to be of sufficient duration to permit conduction of said thyristor to reach a stable value before current flow to said gate electrode of said thyristor ceases.

2. A gate drive circuit for a thyristor comprising:
means for supplying current to a gate electrode of said thyristor including a power supply, and,
an amplifier supplied by said power supply, said amplifier having an output for supplying current to said gate electrode of said thyristor, and said amplifier having an input, and said amplifier responsive to an input signal for turning ON current to said gate electrode, and responsive to an input signal for turning OFF current to said gate electrode;
means for generating a timing signal to initiate conduction of said thyristor;
means, responsive to a voltage from cathode to anode of said thyristor, for generating a "voltage level" signal when said voltage from cathode to anode of said thyristor is reduced by conduction of said thyristor; and,
means, responsive to said "means for generating a voltage level signal and said means for generating a timing signal", for commanding said "means for supplying current to a gate electrode" to supply current to said gate electrode of said thyristor and for commanding said "means for supplying current to a gate electrode" to cease supplying current to said gate electrode of said thyristor at a predetermined time interval following generation of a voltage level signal by said "means for generating a voltage level signal", said predetermined time interval being chosen to be of sufficient duration to permit conduction of said thyristor to reach a stable value before current flow to said gate electrode of said thyristor ceases.

3. A gate drive circuit for a thyristor comprising:
means for supplying current to a gate electrode of said thyristor;
means for generating a timing signal to initiate conduction of said thyristor;
means, responsive to a voltage from cathode to anode of said thyristor, for generating a "voltage level" signal when said voltage from cathode to anode of said thyristor is reduced by conduction of said thyristor including a light emitting diode powered by a voltage between said cathode and said anode of said thyristor, and coupled to a photo sensor controlled by light emitted by said light emitting diode; and,
means, responsive to said "means for generating a voltage level signal and said means for generating a timing signal", for commanding said "means for supplying current to a gate electrode" to supply current to said gate electrode of said thyristor and for commanding said "means for supplying current to a gate electrode" to cease supplying current to said gate electrode of said thyristor at a predetermined time interval following generation of a voltage level signal by said "means for generating a voltage level signal", said predetermined time interval being chosen to be of sufficient duration to permit conduction of said thyristor to reach a stable value before current flow to said gate electrode of said thyristor ceases.

4. A gate drive circuit for a thyristor comprising:
means for supplying current to a gate electrode of said thyristor;
means for generating a timing signal to initiate conduction of said thyristor;
means, responsive to a voltage from cathode to anode of said thyristor, for generating a "voltage level" signal when said voltage from cathode to anode of said thyristor is reduced by conduction of said thyristor including, a diode bridge connected between said anode and said cathode of said thyristor, a light emitting diode powered by said bridge, and, a photo sensor controlled by light emitted by said light emitting diode for generating said "voltage level" signal in response to said voltage from said cathode to said anode of said thyristor; and, means, responsive to said "means for generating a voltage level signal and said means for generating a timing signal", for commanding said "means for supplying current to a gate electrode" to supply current to said gate electrode of said thyristor and for commanding said "means for supplying current to a gate electrode" to cease supplying current to said gate electrode of said thyristor at a predetermined time interval following generation of a voltage level signal by said "means for generating a voltage level signal", said predetermined time interval being chosen to be of sufficient duration to permit conduction of said thyristor to reach a stable value before current flow to said gate electrode of said thyristor ceases.

5. A gate drive circuit for a thyristor comprising:

means for supplying current to a gate electrode of said thyristor;

means for generating a timing signal to initiate conduction of said thyristor;

means, responsive to a voltage from cathode to anode of said thyristor, for generating a "voltage level" signal when said voltage from cathode to anode of said thyristor is reduced by conduction of said thyristor;

and means, responsive to said "means for generating a voltage level signal and said means for generating a timing signal", for commanding said "means for supplying current to a gate electrode" to supply current to said gate electrode of said thyristor and for commanding said "means for supplying current to a gate" to cease supplying current to said gate electrode of said thyristor at a predetermined time interval following generation of a voltage level signal by said "means for generating a voltage level signal", said predetermined time interval being chosen to be of sufficient duration to permit conduction of said thyristor to reach a stable value before current flow to said gate electrode of said thyristor ceases, said means for commanding including:

a circuit, a capacitor charged by an output of said circuit, and a voltage threshold detector for generating a command signal for commanding said means for supplying current to a gate electrode of said thyristor when a voltgage across said capacitor reached a predetermined voltage.

6. The apparatus as in claim 1 wherein said means for commanding said "means for supplying current to a gate electrode" to supply current to said gate electrode of said thyristor and for commanding said "means for supplying current to a gate electrode" to cease supplying current to said gate electrode of said thyristor at a predetermined time interval following generation of a voltage level signal by said "means for generating a voltage level signal" further comprises:

a logic circuit having a first input connected to said means for generating a "voltage level" signal when said voltage from cathode to anode of said thyristor is reduced by conduction of said thyristor, having a second input connected to said means for generating a timing signal to initiate conduction of said thyristor, and having an output;

a capacitor connected to said output of said logic circuit;

a transistor wherein conduction is initiated by voltage across said capacitor exceeding a predetermined voltage; and, a transformer having a primary driven by said transistor and having a secondary for supplying said current to said gate electrode of said thyristor.

7. A gate drive circuit for a thyristor comprising:

a thyristor gate driver for supplying current to a gate electrode of said thyristor;

a timing circuit for generating a timing signal to initiate conduction of said thyristor;

a voltage sensor, responsive to a voltage from cathode to anode of said thyristor, for generating a voltage level signal when said voltage from cathode to anode of said thyristor is reduced by conduction of said thyristor;

a logic circuit, responsive to said timing signal and responsive to said voltage level signal, for generating a driver signal;

a delay circuit responsive to said driver signal for generating a command signal, where said command signal is delayed by a predetermined time interval from said driver signal, and said command signal enables said gate driver to supply current to said gate electrode of said thyristor in response to said timing signal, and disables said gate driver to cease supplying current to said gate electrode of said thyristor in response to said voltage level signal, said predetermined time interval being chosen to be of sufficient duration to permit conduction of said thyristor to reach a stable value before current flow to said gate electrode of said thyristor ceases.

8. The apparatus as in claim 1 wherein said predetermined time interval is chosen to give a gating pulse to said thyristor of duration between 20 and 100 microseconds.

9. The apparatus as in clam 1 wherein said predetermined time interval is chosen to give a gating pulse to said thyristor of duration between 30 to 70 microseconds.

10. A gate drive circuit for a thyristor comprising:

a transformer having a secondary winding for supplying current to a gate electrode of said thyristor, and having a primary winding;

a transistor for supplying current to said primary winding when said transistor is in a conducting state, a timing circuit for generating a timing signal to initiate conduction of said thyristor;

a diode bridge connected between an anode and a cathode of said thyristor;

a light emitting diode powered by current flow from said diode bridge;

a phototransistor controlled by light emitted from said light emitting diode, said phototransistor generating a first logic signal when said voltage from cathode to anode of said thyristor is reduced by conduction of said thyristor;

an AND circuit responsive to said first logic signal, responsive to said timing signal, and responsive to a "conduction inhibit signal" for generating an output; and, a capacitor connected to said output of said AND circuit, and an input to said transistor connected to said capacitor, said transistor being driven into a conducting state when a voltage across said capacitor reaches a predetermined voltage, wherein said transistor, when in said conducting state, permits current flow through said transformer primary winding, thereby supplying said current to said gate electrode of said thyristor.

11. A method for controlling the current flow to the gate of a thyristor having a gate driver circuit comprising:
generating a timing signal to initiate conduction of said thyristor;
generating a voltage level signal when said voltage from cathode to anode of said thyristor is reduced by conduction of said thyristor;
generating a driver signal in response to said timing signal and said voltage level signal;
generating a command signal, where said command signal is delayed by a predetermined time interval from said driver signal, and said command signal enables said gate driver to supply current to said gate electrode of said thyristor in response to said timing signal, and disables said gate driver to cease supplying current to said gate electrode of said thyristor in response to said voltage level signal, said predetermined time interval being chosen to be of sufficient duration to permit conduction of said thyristor to reach a stable value before current flow to said gate electrode of said thyristor ceases.

12. A gate drive circuit for a thyristor comprising:
a thyristor gate driver for supplying current to a gate electrode of said thyristor;
a timing circuit for generating a timing signal to initiate conduction of said thyristor;
a voltage sensor, responsive to a voltage from cathode to anode of said thyristor, for generating a voltage level signal when said voltage from cathode to anode of said thyristor is reduced by conduction of said thyristor;
a logic circuit, responsive to said timing signal and responsive to said voltage level signal, for generating a driver signal;
a delay circuit responsive to said driver signal for generating a command signal, where said command signal is delayed by a predetermined time interval from said driver signal, and said command signal enables said gate driver to supply current to said gate electrode of said thyristor in response to said timing signal, and disables said gate driver to cease supplying current to said gate electrode of said thyristor in response to said voltage level signal, said predetermined time interval being chosen to be of sufficient duration to permit conduction of said thyristor to reach a stable value before current flow to said gate electrode of said thyristor ceases.

13. A gate drive circuit for a thyristor comprising:
a thyristor gate driver for supplying current to a gate electrode of said thyristor;
a timing circuit for generating a timing signal to initiate conduction of said thyristor;
a voltage sensor, responsive to a voltage from cathode to anode of said thyristor, for generating a first logic signal when said voltage from cathode to anode of said thyristor is reduced by conduction of said thyristor;
a delay circuit responsive to said first logic signal for generating a second logic signal, where said second logic signal is delayed by a predetermined time interval from said first logic signal; and,
a logic circuit, responsive to said timing signal and responsive to said second logic signal, for commanding said gate driver to supply current to said gate electrode of said thyristor in response to said timing signal and for commanding said gate driver to cease supplying current to said gate electrode of said thyristor in response to said second logic signal, said predetermined time interval being chosen to be of sufficient duration to permit conduction of said thyristor to reach a stable value before current flow to said gate electrode of said thyristor ceases.

14. A gate drive circuit for a thyristor selectively conducting a load current to a load comprising:
means for supplying current to a gate electrode of said thyristor;
means for generating a timing signal to initiate conduction of said thyristor said means for generating a timing signal including means for detecting the event of said load current reaching zero and said means for generating a timing signal generating said timing signal at a predetermined OFF TIME following said event of said load current reaching zero;
means, responsive to a voltage from cathode to anode of said thyristor, for generating a "voltage level" signal when said voltage from cathode to anode of said thyristor is reduced by conduction of said thyristor; and,
means, responsive to said "means for generating a timing signal" and said "means for generating a voltage level signal", for commanding said "means for supplying current to a gate electrode" to supply current to said gate electrode of said thyristor and for commanding said "means for supplying current to said gate electrode" to cease supplying current to said gate electrode of said thyristor at a predetermined time interval following generation of a voltage level signal by said "means for generating a voltage level signal", said predetermined time interval being chosen to be of sufficient duration to permit conduction of said thyristor to reach a stable value before current flow to said gate electrode of said thyristor ceases.

15. A gate drive circuit for a thyristor selectively conducting load current to a load comprising:
means for supplying current to a gate electrode of said thyristor;
means for generating a timing signal to initiate conduction of said thyristor said means for generating a timing signal including means for detecting the event of said load current reaching zero and said means for generating a timing signal generating said timing signal at substantially the same time that said load current reaches zero;
means, responsive to a voltage from cathode to anode of said thyristor, for generating a "voltage level" signal when said voltage from cathode to anode of said thyristor is reduced by conduction of said thyristor; and,
means, responsive to said "means for generating a timing signal" and said "means for generating a voltage level signal", for commanding said "means for supplying current to a gate electrode" to supply current to said gate electrode of said thyristor and for commanding said "means for supplying current to a gate electrode" to cease supplying current to said gate electrode of said thyristor at a predetermined time interval following generation of a voltage level signal by said "means for generating a voltage level signal", said predetermined time interval being chosen to be of sufficient duration to permit conduction of said thyristor to reach a stable value before current flow to said gate electrode of said thyristor ceases.

* * * * *